US008981558B2

(12) United States Patent
Ide

(10) Patent No.: US 8,981,558 B2
(45) Date of Patent: Mar. 17, 2015

(54) SEMICONDUCTOR DEVICE

(75) Inventor: Akira Ide, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 305 days.

(21) Appl. No.: 13/440,583

(22) Filed: Apr. 5, 2012

(65) Prior Publication Data
US 2012/0256310 A1 Oct. 11, 2012

(30) Foreign Application Priority Data

Apr. 8, 2011 (JP) ................. P2011-086715

(51) Int. Cl.
H01L 23/48 (2006.01)
H01L 23/498 (2006.01)
H01L 23/544 (2006.01)
H01L 25/065 (2006.01)
H01L 21/768 (2006.01)
H01L 23/522 (2006.01)
H01L 25/00 (2006.01)

(52) U.S. Cl.
CPC ............ H01L 23/498 (2013.01); H01L 23/481 (2013.01); H01L 23/544 (2013.01); H01L 25/0657 (2013.01); H01L 21/76898 (2013.01); H01L 23/522 (2013.01); H01L 25/50 (2013.01); *H01L 2223/5442* (2013.01); *H01L 2223/54426* (2013.01); *H01L 2223/54473* (2013.01); *H01L 2225/06593* (2013.01); *H01L 2224/16145* (2013.01); *H01L 2224/16225* (2013.01); *H01L 2924/15311* (2013.01); *H01L 2225/06517* (2013.01); *H01L 2225/06513* (2013.01); *H01L 2225/06541* (2013.01); *H01L 2225/06565* (2013.01)
USPC ........................................ 257/737

(58) Field of Classification Search
CPC ............... H01L 2924/01079; H01L 23/49811; H01L 23/498; H01L 2924/14
USPC ...................... 257/737, 773, E23.068, E23.06
See application file for complete search history.

(56) References Cited

U.S. PATENT DOCUMENTS

| | | | | |
|---|---|---|---|---|
| 6,472,305 B1 * | 10/2002 | Ozaki et al. | .................. | 438/613 |
| 7,919,844 B2 * | 4/2011 | Ozguz et al. | .................. | 257/686 |
| 8,344,512 B2 * | 1/2013 | Knickerbocker | ............. | 257/773 |
| 8,350,389 B2 * | 1/2013 | Itaya et al. | .................... | 257/774 |
| 2007/0076577 A1 | 4/2007 | Furuichi | | |

FOREIGN PATENT DOCUMENTS

JP 2006-140300 A 6/2006
JP 2007-088124 A 4/2007

* cited by examiner

*Primary Examiner* — Fernando L Toledo
*Assistant Examiner* — Neil Prasad
(74) *Attorney, Agent, or Firm* — McGinn IP Law Group, PLLC

(57) ABSTRACT

A semiconductor device includes a multi-level wiring structure that includes a first wring layer, a plurality of first patterns, and a first mark. The first wring layer is disposed at a first wiring level of the multi-level wiring structure. The plurality of first patterns is disposed over the first wring layer. The plurality of first patterns is disposed at a second wiring level of the multi-level wiring structure. The second wiring level is above the first wiring level. The plurality of first patterns is disposed over the first wring layer. The plurality of first patterns is disposed at a second wiring level of the multi-level wiring structure. The second wiring level is above the first wiring level. The first mark is disposed over the first wring layer. The first mark is disposed at a third wiring level. The third wiring level is above the second wiring level.

20 Claims, 30 Drawing Sheets

SEMICONDUCTOR DEVICE

BACKGROUND OF THE INVENTION

1. Field of the Invention

The present invention generally relates to a semiconductor device.

Priority is claimed on Japanese Patent Application No. 2011-086715, filed Apr. 8, 2011, the content of which is incorporated herein by reference.

2. Description of the Related Art

FIG. 20 is a cross-sectional view illustrating a schematic configuration of a semiconductor device in the related art. A semiconductor device 1p shown in FIG. 20 is a stack-type semiconductor device of a chip-on-chip (CoC) type.

The semiconductor device 1p includes a wiring board 2 and a chip stacked body 3p mounted on one surface of the wiring board 2. The chip stacked body 3p includes a plurality of memory chips 31pa to 31pd and an interface chip 32p. Each of the memory chips 31pa to 31pd and the interface chip 32p includes a surface bump electrode 311 and a rear bump pad 312 corresponding to the surface bump electrode 311, and the surface bump electrode 311 and the rear bump electrode 312 are electrically connected by a through electrode 4. The plurality of memory chips 31pa to 31pd and the interface chip 32p are electrically connected to each other via the surface bump electrode 311, the rear bump electrode 312, and the through electrode 4.

In addition, the surface bump electrode 311 of one surface (a lower-side surface in FIG. 20) of the interface chip 32p is connected to an electrode pad 23 of the wiring board 2.

An assembly process of the semiconductor device 1p shown in FIG. 20 will be described. FIG. 21 is a view for explaining an assembly process.

As shown in FIG. 21, the memory chip (a second-level semiconductor chip) 31pb is stacked and mounted on the memory chip 31pa held on a level 99.

Each of the memory chips 31pa to 31pd and the interface chip 32p includes a surface mark and a rear mark in a surface side and a rear surface side of the chip, respectively. The surface mark and the rear mark are used for alignment when semiconductor chips are stacked. Specifically, the surface mark of the memory chip 31pa is photographed by a board-side recognition camera of a flip chip bonder and a coordinate of the memory chip 31pa on the level is recognized. The rear mark of the memory chip 31pb picked up by a tool BT of the flip chip bonder is photographed by a part-side recognition camera of the flip chip bonder and a coordinate of the memory chip 31pb on the tool is recognized. According to the obtained position information, a position of the tool is adjusted with respect to the level and the memory chip 31pb is stacked and mounted on the memory chip 31pa so that the surface bump electrode 311 of the memory chip 31pa and the rear bump electrode 312 of the memory chip 31pb accurately overlap.

Similarly, the memory chips (third- and fourth-level semiconductor chips) 31pc and 31pd and the interface chip 32p (fifth-level semiconductor chip) are stacked and mounted.

As described above, the surface mark and the rear mark are employed to perform accurate alignment between the semiconductor chips.

FIG. 22 is a cross-sectional view of a mark portion of a memory chip 31p.

As shown in the cross-sectional view of FIG. 22, the memory chip 31p includes a multi-layer wiring structure including wiring tungsten WT and first to third aluminum wirings 1ALp, 2ALp, and 3AL.

In addition, as shown in FIG. 22, a surface mark 313 including the third aluminum wiring 3AL is formed in a surface side of the memory chip 31p and the wiring tungsten WT connected to a through electrode TSV (through-silicon via) for a rear mark is formed below the surface mark 313. A rear bump electrode 312 is further connected to the through electrode TSV for a rear mark, and the through electrode TSV for a rear mark and the rear bump electrode 312 form a rear mark 314. The through electrode TSV for a rear mark penetrates a semiconductor substrate 319.

In addition, a polyimide film PI is formed on the multi-layer wiring structure. The polyimide film PI has a PI opening PIO formed in an area including a portion on the surface mark 313.

In a recent semiconductor process, chemical mechanical polishing (CMP) technology is used for planarization. In general, in order to correct a difference in polishing state between a pattern-dense portion and a pattern-sparse portion in the CMP process, a dummy pattern may be arranged in the sparse portion. The CMP dummy pattern includes a minute pattern such as the first and second aluminum wirings, the wiring tungsten, gates, and shallow trench isolations STI in either side of the PI opening.

In the related art, the dummy pattern is mostly prohibited from being arranged below the PI opening PIO due to the following two reasons. First, there is a case in which the minute dummy patterns of wiring layers of the first and second aluminum wirings become an obstacle in recognition of the surface mark 313 of the third aluminum wiring 3AL. Second, when the minute pattern such as a gate is present below the surface mark, there is a case in which the gate of the minute pattern serves as a hard mask and causes occurrence of particles in a dry etching process of the through electrode TSV for a rear mark since the through electrode TSV for a rear mark is below the wiring tungsten pad WTP.

Therefore, a prohibition area PA is provided even in a portion of the surface mark described herein. In addition, in FIG. 22, the CMP dummy pattern prohibition area PA almost corresponds to the PI opening PIO (to be described in detail later).

It has become clear from the inventor's research that in the assembly process, contrast of the surface mark 313 is significantly degraded in recognition of the surface mark 313 through the recognition camera when the chip itself is embedded in the stack semiconductor device.

FIG. 23 is a cross-sectional view illustrating a PI opening PIO in which incident light (a solid line) and reflected light (a dashed line) of lighting are indicated. Since only a dielectric material such as silicon oxide ($SiO_2$) is present in the PI opening PIO over a pad of wiring tungsten WT, attenuation of visible light is very small. Thus, reflection from a wiring tungsten pad WTP, which is a background of a surface mark 313, is large and contrast of the surface mark 313 is significantly degraded.

As a result, there is a problem that a recognition error of the surface mark 313 occurs in a TSV stacking process and a throughput of the above-described assembly process is considerably degraded.

Documents related to the above-described technical content include Japanese Patent Laid-open Publication No. 2006-140300 and Japanese Patent Laid-open Publication No. 2007-088124.

Japanese Patent Laid-open Publication No. 2006-140300 discloses that when a multilayered circuit pattern is formed on a semiconductor substrate, with respect to an accuracy measurement mark for inspecting whether a resist pattern formed by exposure accurately overlaps a circuit pattern of an underlying layer, a dummy pattern is formed in a mask formation area of an underlying wiring layer below the wiring layer in which a main scale pattern is formed, in order for the main scale pattern not to be affected by dishing during CMP.

Japanese Patent Laid-open Publication No. 2007-088124 describes an alignment mark of a mounting board.

Japanese Patent Laid-open Publication No. 2006-140300 thoroughly discloses only the accuracy measurement mark merely used for alignment of the resist pattern when forming a device forming layer. Therefore, Japanese Patent Laid-open Publication No. 2006-140300 does not describe recognition of an alignment mark after forming a semiconductor chip at all or a mark symmetrically arranged with respect to the accuracy measurement mark, and does not relate to a semiconductor chip of a stack semiconductor device.

Japanese Patent Laid-open Publication No. 2007-088124 discloses only the alignment mark when a device is mounted on a flexible board and does not relate to a semiconductor chip of a stack semiconductor device.

SUMMARY

In one embodiment, a semiconductor device may include, but is not limited to, a multi-level wiring structure that includes a first wring layer, a plurality of first patterns, and a first mark. The first wring layer is disposed at a first wiring level of the multi-level wiring structure. The plurality of first patterns is disposed over the first wring layer. The plurality of first patterns is disposed at a second wiring level of the multi-level wiring structure. The second wiring level is above the first wiring level. The plurality of first patterns is disposed over the first wring layer. The plurality of first patterns is disposed at a second wiring level of the multi-level wiring structure. The second wiring level is above the first wiring level. The first mark is disposed over the first wring layer. The first mark is disposed at a third wiring level. The third wiring level is above the second wiring level.

In another embodiment, a semiconductor device may include, but is not limited to, a multi-level wiring structure and a resin layer. The multi-level wiring structure may include, but is not limited to, a plurality of patterns disposed at a first wiring level of the multi-level wiring structure and a first mark disposed at a second wiring level of the multi level wiring structure. The second wiring level is above the first wiring level. The resin layer is disposed over the multi-level wiring structure. The resin layer has an opening that is positioned over the first mark and at least one the plurality of patterns.

In still another embodiment, a semiconductor device may include, but is not limited to, a multi-level wiring structure, an insulation layer, a plurality of bump electrodes, a plurality of first wirings, a second wiring, and a plurality of third wirings. The multi-level wiring structure includes a first level wiring layer and a second level wiring layer formed over the first level wiring layer. The insulation layer is formed over the multi-level wiring structure. The insulation layer has a plurality of first openings and a second opening. The plurality of bump electrodes is each disposed in an associated one of the first openings. The plurality of first wirings is produced as the second level wiring layer. Each of the first wirings is vertically arranged with an associated one of the first openings of the insulation layer. Each of the first wirings is coupled to an associated one of the bump electrodes. The second wiring is produced as the second level wiring layer. The second wiring is vertically arranged with the second opening of the insulation layer. The second wiring is free of a contact with any one of the bump electrodes. The plurality of third wirings is produced as the first wiring layer. The plurality of third wirings is disposed in a first region that is vertically arranged with the first opening of the insulation layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
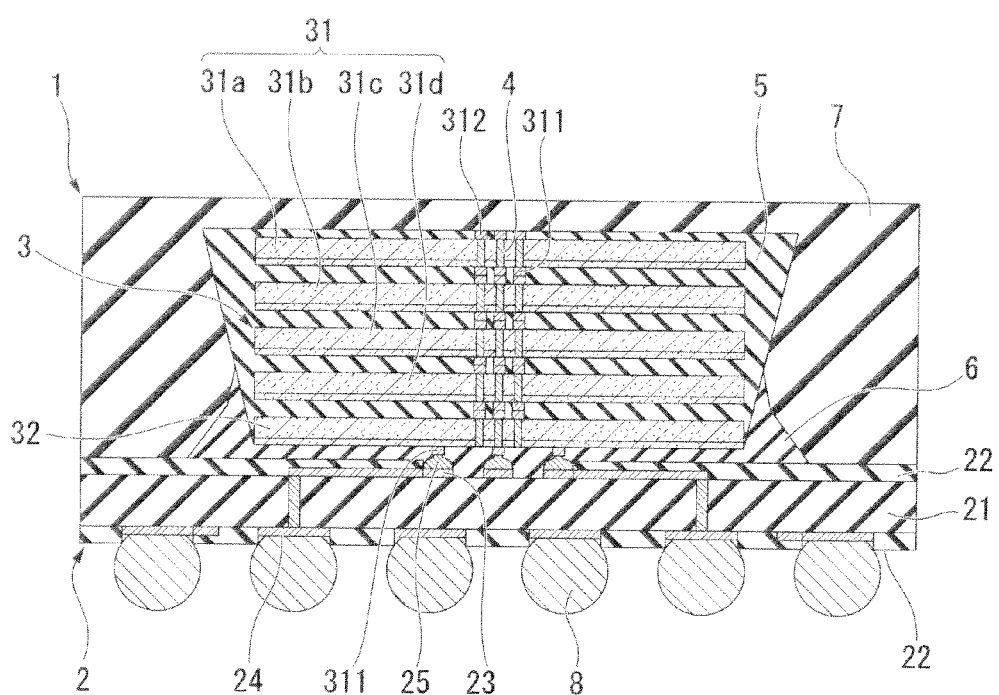
FIG. 1 is a fragmentary cross sectional elevation view of a schematic configuration of a semiconductor device in accordance with one or more embodiments of the present invention.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a multi-level wiring structure that includes a first wring layer, a plurality of first patterns, and a first mark. The first wring layer is disposed at a first wiring level of the multi-level wiring structure. The plurality of first patterns is disposed over the first wring layer. The plurality of first patterns is disposed at a second wiring level of the multi-level wiring structure. The second wiring level is above the first wiring level. The plurality of first patterns is disposed over the first wring layer. The plurality of first patterns is disposed at a second wiring level of the multi-level wiring structure. The second wiring level is above the first wiring level. The first mark is disposed over the first wring layer. The first mark is disposed at a third wiring level. The third wiring level is above the second wiring level.

In some cases, the semiconductor device may further include, but is not limited to, a semiconductor substrate on which the multi-level wiring structure being disposed, and a first penetration electrode that penetrates the semiconductor substrate, and that is in contact with the first wiring layer at one end thereof.

In some cases, the semiconductor device may further include, but is not limited to, a second mark disposed at the other end of the first penetration electrode.

In some cases, the plurality of first patterns is electrically floated.

In some cases, the plurality of first patterns is positioned in a region that is vertically arranged with the first mark.

In some cases, the multi-level wiring structure further may include, but is not limited to, a plurality of second patterns disposed over the first wring layer. The plurality of second patterns is disposed at a fourth wiring level of the multi-level wiring structure. The fourth wiring level is between the second wiring level and the third wiring level.

In some cases, each of the plurality of second patterns is larger in size than each of the plurality of first patterns.

In some cases, the semiconductor device may further include, but is not limited to, a plurality of second penetration electrodes each penetrating through the second substrate; and a plurality of terminals, each of the terminals being formed over the multi-level wiring structure. Each of the terminals is coupled to an associated one of the plurality of second penetration electrodes. The first penetration electrode is free from being coupled to any one of the terminals.

In some cases, the semiconductor device may further include, but is not limited to, a plurality of third patterns. Each of the plurality of third patterns is disposed at the third level of the multi-level wiring structure. Each of the plurality of third patterns is coupled between an associated one of the second penetration electrodes and an associated one of the terminals. Each of the third patterns is different in shape from the first mark.

In another embodiment, a semiconductor device may include, but is not limited to, a multi-level wiring structure and a resin layer. The multi-level wiring structure may include, but is not limited to, a plurality of patterns disposed at a first wiring level of the multi-level wiring structure and a first mark disposed at a second wiring level of the multi-level wiring structure. The second wiring level is above the first wiring level. The resin layer is disposed over the multi-level wiring structure. The resin layer has an opening that is positioned over the first mark and at least one the plurality of patterns.

In some cases, the semiconductor device may further include, but is not limited to, a semiconductor substrate on which the multi-level wiring structure is disposed; a penetration electrode that penetrates the semiconductor substrate; and a second mark coupled to the penetration electrode.

In some cases, the multi-level wiring structure may further include, but is not limited to, a third wiring layer disposed under the first wiring layer. The third wiring layer is disposed at a third wiring level below the first wiring level. The penetration electrode extends to the third wiring layer.

In some cases, the plurality of patterns is electrically floated.

In still another embodiment, a semiconductor device may include, but is not limited to, a multi-level wiring structure, an insulation layer, a plurality of bump electrodes, a plurality of first wirings, a second wiring, and a plurality of third wirings. The multi-level wiring structure includes a first level wiring layer and a second level wiring layer formed over the first level wiring layer. The insulation layer is formed over the multi-level wiring structure. The insulation layer has a plurality of first openings and a second opening. The plurality of bump electrodes is each disposed in an associated one of the first openings. The plurality of first wirings is produced as the second level wiring layer. Each of the first wirings is vertically arranged with an associated one of the first openings of the insulation layer. Each of the first wirings is coupled to an associated one of the bump electrodes. The second wiring is produced as the second level wiring layer. The second wiring is vertically arranged with the second opening of the insulation layer. The second wiring is free of a contact with any one of the bump electrodes. The plurality of third wirings is produced as the first wiring layer. The plurality of third wirings is disposed in a first region that is vertically arranged with the first opening of the insulation layer.

In some cases, the multi-level wiring structure may further include, but is not limited to, a third level wiring layer. The first level wiring layer is formed over the third level wiring layer. The semiconductor device may further include, but is not limited to, a plurality of fourth wirings each produced as the third level wiring layer and vertically arranged with a corresponding one of the first wirings. The fifth wiring is produced as the third level wiring layer and vertically arranged with the second wiring.

In some cases, the semiconductor device may further include, but is not limited to, a semiconductor substrate on which the multi-level wiring structure is formed, a plurality of first penetrating electrode penetrating through the semiconductor substrate, each of the first penetrating electrodes extending to reach a corresponding one of the fourth wirings, and a second penetrating electrode penetrating through the semiconductor substrate and extending to reach the fifth wiring.

In some cases, the multi-level wiring structure may further include, but is not limited to, a fourth level wiring layer intervened between the first and the third level wiring layers. The device further may include, but is not limited to, a plurality of sixth wirings produced as the fourth level wiring layer and disposed in a second region that vertically arranged with the first region.

In some cases, each of the sixth wirings is smaller in size than each of the third wirings.

In some cases, each of the fourth wirings is electrically connected to the corresponding one of the first wirings. The fifth wiring is electrically disconnected from the second wiring.

In some cases, each of the third wirings is electrically floated.

According to the semiconductor device of the present invention, in particular, even when a plurality of first patterns are present below a first mark, degradation of contrast of the first mark is suppressed. Therefore, in a stacking process of a semiconductor chip itself, it is possible to avoid a mark recognition error and thus to improve a throughput.

Hereinafter, embodiments of the present invention will be described with reference to the accompanying drawings.

First Embodiment

FIG. 1 is a cross-sectional view illustrating a schematic configuration of a semiconductor device according to an embodiment of the present invention. A semiconductor device 1 shown in FIG. 1 is a stack-type semiconductor device of a CoC type.

The semiconductor device 1 includes a substantially quadrangular wiring board 2, in which predetermined wirings are formed. The wiring board 2 is, for example, a glass epoxy board having a thickness of 0.2 mm, the predetermined wirings are formed in either surface of an insulating base 21, and the wirings are partially covered with an insulating layer 22, for example, a solder resist. An opening is formed in a central area of one surface of the wiring board 2, and a plurality of connection pads 23 are formed in a portion of one surface exposed from the opening of the insulating layer (solder resist) 22. Meanwhile, a plurality of lands 24 are formed in a portion of the wiring of the other surface of the wiring board 2 exposed from the insulating layer 22. Here, the connection pads 23 and the lands 24 corresponding thereto are electrically connected by the wiring of the wiring board 2.

A chip stacked body 3 is mounted on one surface of the wiring board 2. The chip stacked body 3 has a substantially quadrangular plate shape and includes a plurality of semiconductor chips which are stacked and in which predetermined circuits are formed on one surface thereof. In these conductor device shown in FIG. 1, for example, four memory chips 31a to 31d in which memory circuits are formed and an interface chip 32 for interface between the memory chip 31 and the wiring board 2 are stacked in five levels. Each of semiconductor chips has, for example, a thickness of 50 μm. A plurality of surface bump electrodes 311 are formed in a central area of one surface of the semiconductor chip and a plurality of rear bump electrodes 312 are formed in a central area of the other surface side of the semiconductor chip. The surface bump electrodes 311 and the rear bump electrodes 312 corresponding thereto are electrically connected by through electrodes 4.

A first encapsulating resin unit 5, for example, including an underfill material is formed in the chip stacked body 3. The encapsulating resin unit 5 is formed to fill gaps between the semiconductor chips.

The surface bump electrode 311 of one surface (a lower-side surface in FIG. 1) of the lowermost semiconductor chip of the chip stacked body 3 is connected to the connection pad 23 of the wiring board 2 via a wire bump 25.

A non conductive paste (NCP) 6 is configured to be disposed around an electrical connection portion between the chip stacked body 3 and the wiring board 2 and to protect the electrical connection portion and bond and fix the chip stacked body 3 to the wiring board 2. A second encapsulating resin unit 7 is formed on one surface of the wiring board 2 to cover the chip stacked body 3.

Solder balls 8 which are external terminals of the semiconductor device 1 are mounted on the plurality of lands 24 of the other surface of the wiring board 2, respectively, and the external terminals are arranged in a lattice form at predetermined intervals.

Figure 2A:
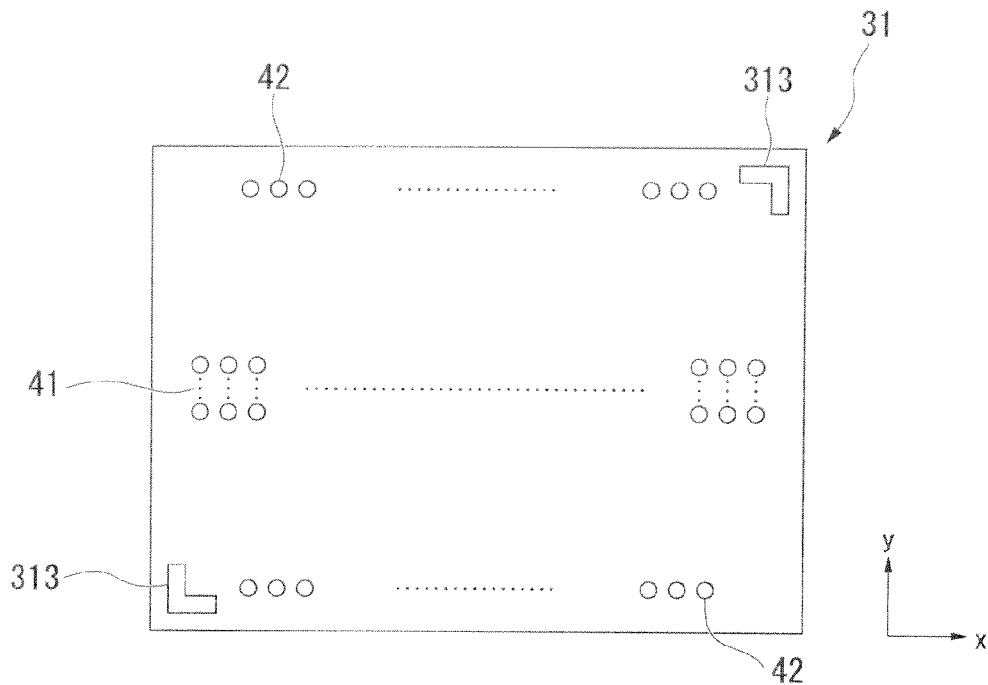
FIG. 2A is a plan view of a circuit formation surface of a memory chip of the semiconductor device of FIG. 1.
Figure 2B:
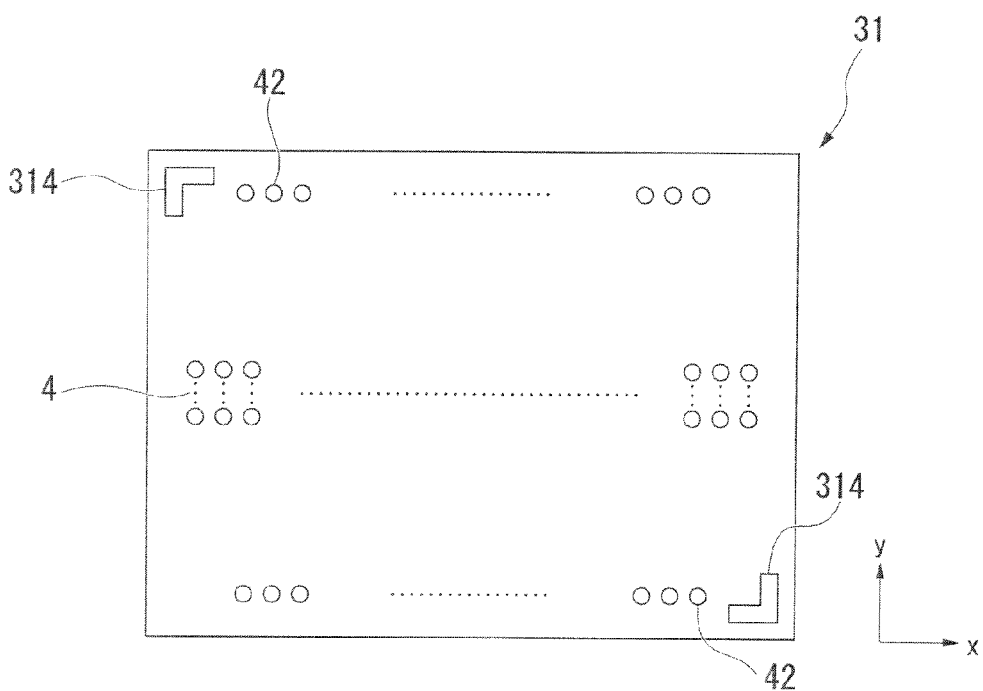
FIG. 2B is a plan view of an opposite surface to the circuit formation surface of a memory chip of the semiconductor device of FIG. 1.

The memory chip 31 of a first embodiment of the present invention will be described. FIGS. 2A and 2B are schematic plan views of a memory chip 31. FIG. 2A is a view when viewed from a circuit forming surface (a surface) and FIG. 2B is a view when viewed from a semiconductor substrate side (a rear surface).

As shown in FIG. 2A, wiring through electrodes 41 are arranged along an x-direction in a central portion of the circuit forming surface of the memory chip 31 in a y-direction. A plurality of dummy bump through electrodes 42 are arranged along each of two lengthwise sides (sides extending in the x-direction of FIG. 2A) of the circuit forming surface of the memory chip 31. The dummy bump through electrodes 42 are provided to prevent the memory chip 31 from being damaged by stress. Further, surface marks 313 are arranged in a pair of corners which are located diagonally to each other so that the surface marks 313 are viewed from a side of the circuit forming surface of the memory chip. Preferably, the surface marks 313 are arranged within an area in which the plurality of dummy bump through electrodes 42 are arranged, that is, on a straight line passing through the plurality of dummy bump through electrodes 42.

As shown in FIG. 2B, in the semiconductor substrate side of the memory chip 31, the wiring through electrodes 41 are arranged along the x-direction in a central portion in the y-direction. The plurality of dummy bump through electrodes 42 are arranged along each of the two lengthwise sides (the sides extending in the x-direction of FIG. 2B) of the semiconductor substrate side of the memory chip 31. Further, rear marks 314 are arranged in a pair of corners which are located diagonally to each other so that the rear marks 314 are viewed from the semiconductor substrate side. The pair of surface marks 313 and the pair of rear marks 314 are provided in facing positions with the semiconductor substrate interposed therebetween.

Preferably, the rear marks 314 are arranged within an area in which the plurality of dummy bump through electrodes 42 are arranged, that is, on a straight line passing through the plurality of dummy bump through electrodes 42.

Figure 3A:
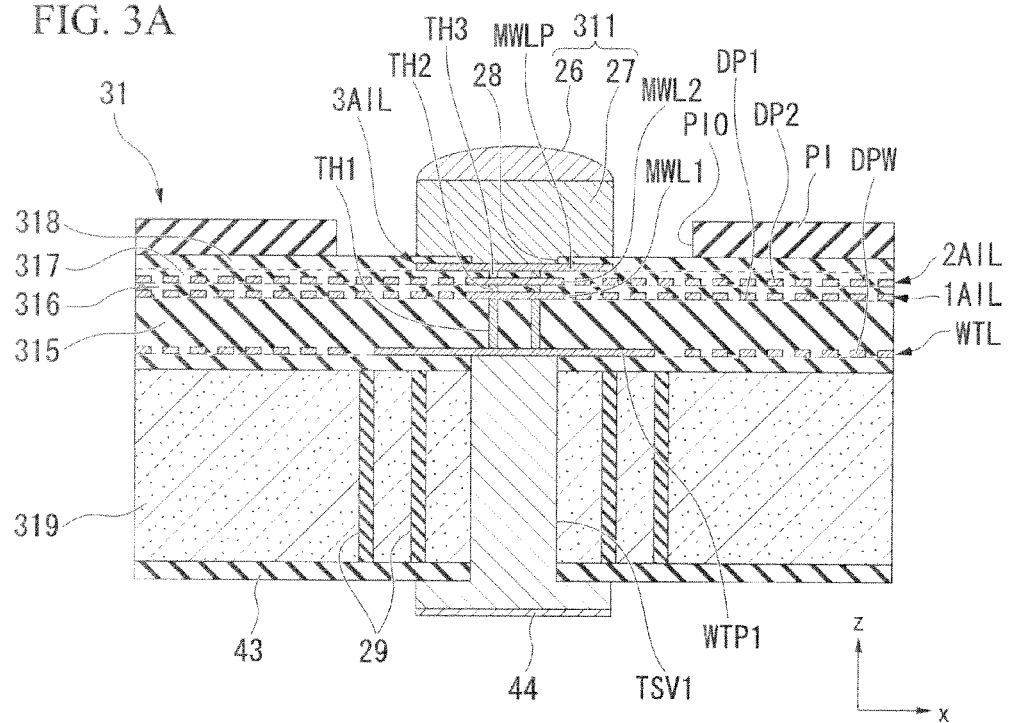
FIG. 3A is a fragmentary cross sectional elevation view of the memory chip.
Figure 3B:
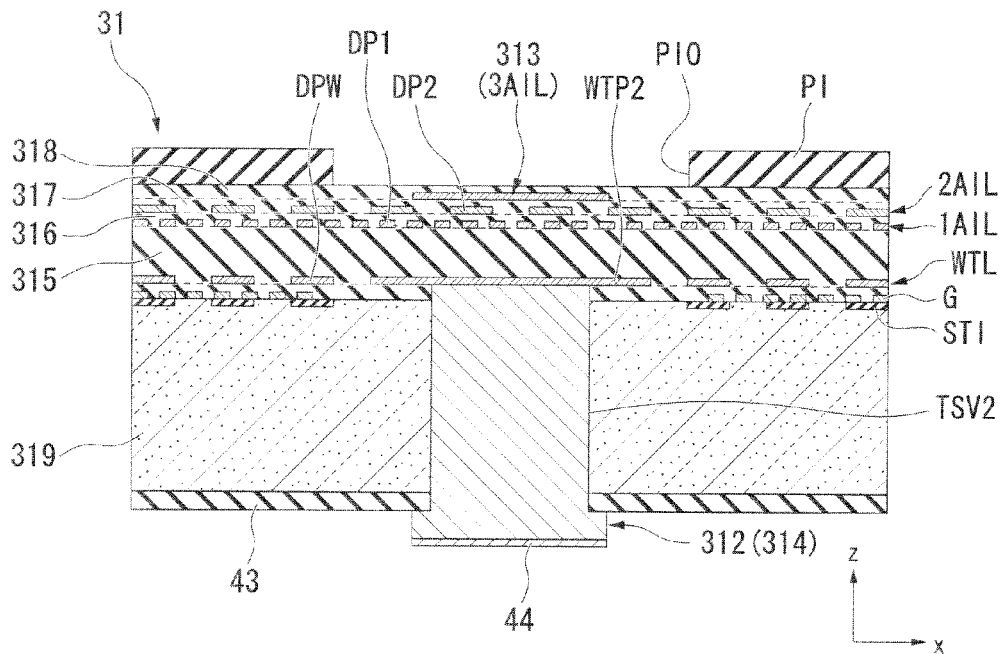
FIG. 3B is a fragmentary cross sectional elevation view of the memory chip.

FIGS. 3A and 3B are cross-sectional views of a peripheral portion of the wiring through electrode 41 of the memory chip 31 (a through electrode portion for dummy bumps is also substantially the same) and a peripheral portion of the surface mark 313 and the rear mark 314 (hereinafter, may be simply referred to as a mark portion).

FIG. 3A illustrates a cross-sectional view of a periphery of the wiring through electrode 41 and FIG. 3B illustrates a cross-sectional view of a mark portion. As shown in FIGS. 3A and 3B, the memory chip 31 includes a multi-layer wiring structure having a wiring tungsten layer WTL, and first to third aluminum wiring layers 1AIL, 2AIL, and 3AIL. First to third interlayer insulating layers 315, 316, and 317 are formed betweens the wiring layers and a fourth interlayer insulating layer 318 is formed between the third aluminum wiring layer 3AIL and a polyimide film PI. In addition, a through electrode TSV1 or a through electrode for a mark penetrating a semiconductor substrate 319 is formed.

As shown in FIG. 3A, in a side of a circuit-forming surface (a surface) of a portion of the wiring through electrode 41, a surface bump electrode 311 including a surface bump 26 and a copper pillar 27 is formed in an opening PIO formed in the polyimide film PI and is electrically connected to a wiring pad MWLP formed as the third aluminum wiring layer 3AIL via a cover opening 28.

Further, the wiring pad MWLP is connected to a second metal wiring MWL2 formed as the second aluminum wiring layer 2AIL via a third through hole TH3 formed in the third interlayer insulating layer 317 and the second metal wiring MWL2 is connected to a first metal wiring MWL1 formed as the first aluminum wiring layer 1AIL via a second through hole TH2 formed in the second interlayer insulating layer 316. The first metal wiring MWL1 is connected to a wiring tungsten pad WTP1 formed as the wiring tungsten layer WTL via a first through hole TH1 formed in the first interlayer insulating layer 315 and the wiring tungsten pad WTP1 is connected to the wiring through electrode TSV1. In addition, an insulating trench 29 is formed in a portion of the wiring through electrode 41 to surround the wiring through electrode TSV1 in the semiconductor substrate 319.

A rear insulating layer 43 and a rear bump 44 are formed in a surface (a rear surface) of the semiconductor substrate side of the wiring through electrode portion and the rear bump 44 is connected to the wiring through electrode TSV1.

As shown in FIG. 3A, a plurality of dummy wirings (dummy patterns) DWP, DP1 and DP2, as well as substantial functional wiring (a wiring tungsten pad WTP1, and the first and second metal wirings MWL1 and MWL2), are formed in the wiring through electrode portion as the respective wiring layers of the wiring tungsten layer WTL, and the first and second aluminum wiring layers 1AIL and 2AIL.

Here, the substantial functional wirings are wirings for propagating power potentials, signal levels, or the like and wirings to which desired potentials corresponding to the power levels or signal levels are applied.

On the other hand, since the dummy wirings (dummy patterns) DPW, DP1, and DP2 are arranged to prevent "dishing" from being generated in an area in which the functional wirings are not present when the interlayer insulating layers are planarized by a CMP method, desired potentials corresponding to the power potentials, signal levels, or the like are not supplied thereto and the dummy patterns are wirings which are in a floating state.

Although FIG. 3A has illustrated that the functional wirings are connected only to the wiring through electrode TSV1, they are not limited thereto. For example, the functional wirings may be arranged to be mixed with the plurality of dummy wirings (dummy patterns) DWP, DP1, and DP2 shown in FIG. 3A.

Meanwhile, as shown in FIG. 3B, in a surface of the mark portion, the surface mark 313 is formed as the third aluminum wiring layer 3AIL located below the opening PIO formed in the polyimide film PI, a wiring tungsten pad WTP2 is formed as the wiring tungsten layer WTL located below the opening PIO, and the wiring tungsten pad WTP2 is connected to the through electrode TSV2 for a mark. In a rear side of the mark portion, a rear bump 44 in which a rear mark is formed is formed below the through electrode TSV2 for a mark.

In the mark portion, a first dummy pattern (a lower dummy pattern) DP1 is formed as the first aluminum wiring layer 1AIL to be covered with the second interlayer insulating layer 316 (that is, not to penetrate the second interlayer insulating layer 316), and a second dummy pattern (an upper dummy pattern) DP2 is formed as the second aluminum wiring layer 2AIL to be covered with the third interlayer insulating layer 317 (that is, not to penetrate the third interlayer insulating layer 317).

The second dummy pattern has a width (a length in the x-direction of FIG. 3B) larger than the first dummy pattern. Preferably, the functional wirings are not arranged in the first and second aluminum wiring layers 1AIL and 2AIL of an area on the wiring tungsten pad WTP2.

Here, the inventor inspected an image from a camera for recognizing a mark in a process of inspecting contrast of the mark, and thus found that, since the CMP dummy pattern is very small, the CMP pattern was not recognized at all in a resolution (about 1 μm) of the camera, and the CMP dummy pattern portion exposed from an edge portion of the opening POI was recognized to be darker than a background. That is, the inventor found that even when a minute pattern, which is smaller than the resolution of the camera, is arranged close to the mark, the pattern is not an obstacle but rather helps to improve the contrast.

Figure 4A:
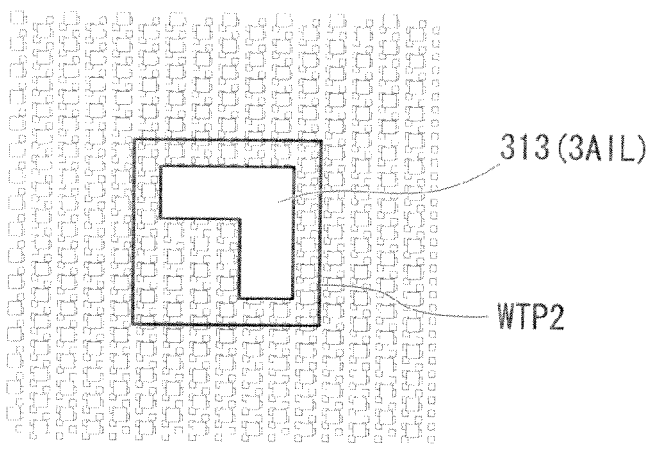
FIG. 4A is a fragmentary plan view of the circuit formation surface of the memory chip of the semiconductor device of FIG. 1.
Figure 4B:
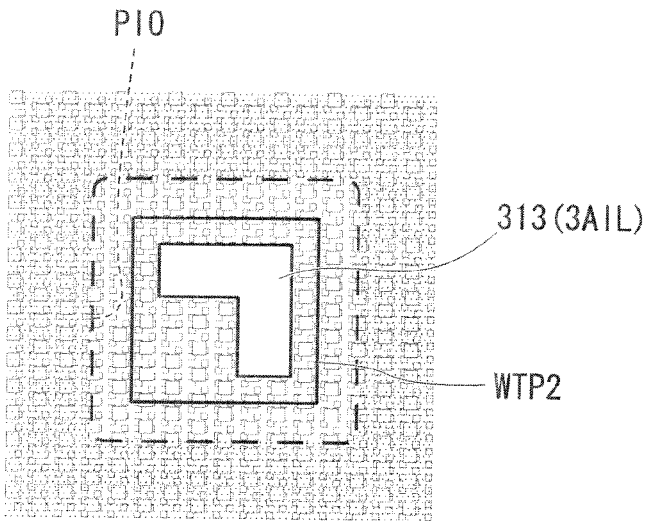
FIG. 4B is a fragmentary plan view of the circuit formation surface of the memory chip of the semiconductor device of FIG. 1.
Figure 4C:
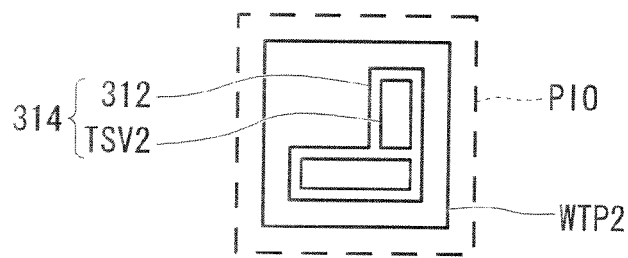
FIG. 4C is a fragmentary plan view of the opposite surface of the memory chip of the semiconductor device of FIG. 1.

FIG. 4A is a schematic plan view of a case in which the polyimide film PI of a portion of the surface mark is removed when viewed from a side of the circuit forming surface (a surface) of a memory chip. FIG. 4B is a schematic plan view including the polyimide film PI. FIG. 4C is a schematic plan view of a portion of the rear mark when viewed from a semiconductor substrate side (a rear surface) of the memory chip.

As shown in FIG. 4A, the surface mark 313 is an L-shaped mark formed as the third aluminum wiring layer 3AIL. As shown in FIG. 4B, the polyimide film PI corresponding to an area thereof is opened to expose the surface mark 313. In addition, as shown in FIG. 4B, the wiring tungsten pad WTP2, which is connected to the through electrode TSV2 for a mark formed as the wiring tungsten layer WTL, is formed below the surface mark 313. The rear bump electrode 312 is connected to the through electrode TSV2 for a mark. As shown in FIG. 4C, the rear mark 314 having an L shape including the through electrode TSV2 for a mark and the rear bump electrode 312 is formed. The through electrode TSV2 for a mark penetrates the semiconductor substrate 319.

Here, in the chip of the semiconductor device according to the first embodiment of the present invention, as shown in FIGS. 3B, 4A, and 4B, even in an area below the opening POI (including a portion beneath the surface mark) formed in the polyimide film PI (that is, an area on the wiring tungsten pad WTP2 formed as the wiring tungsten layer WTL), the first and second dummy wirings (dummy patterns) DP1 and DP2 are formed as the first and second aluminum wiring layers 1AIL and 2AIL, respectively. In addition, among an area below the opening PIO (including an area on the wiring tungsten pad WTP2) formed in the polyimide film PI, a wiring layer in which the dummy wirings (dummy patterns) DP1 and DP2 are formed includes a portion on the wiring tungsten layer WTL, that is, only the first and second aluminum wiring layers 1AIL and 21AI and the wiring tungsten layer WTL, the gate G, and the STI are excluded from the dummy patterns.

Here, the wiring tungsten layer WTL corresponds to a first wiring layer, the first aluminum wiring layer 1AIL corresponds to a second wiring layer, and the third aluminum wiring layer 3AIL corresponds to a third wiring layer. The surface mark 313 and the rear mark 314 correspond to a first mark and a second mark, respectively.

Figure 5:
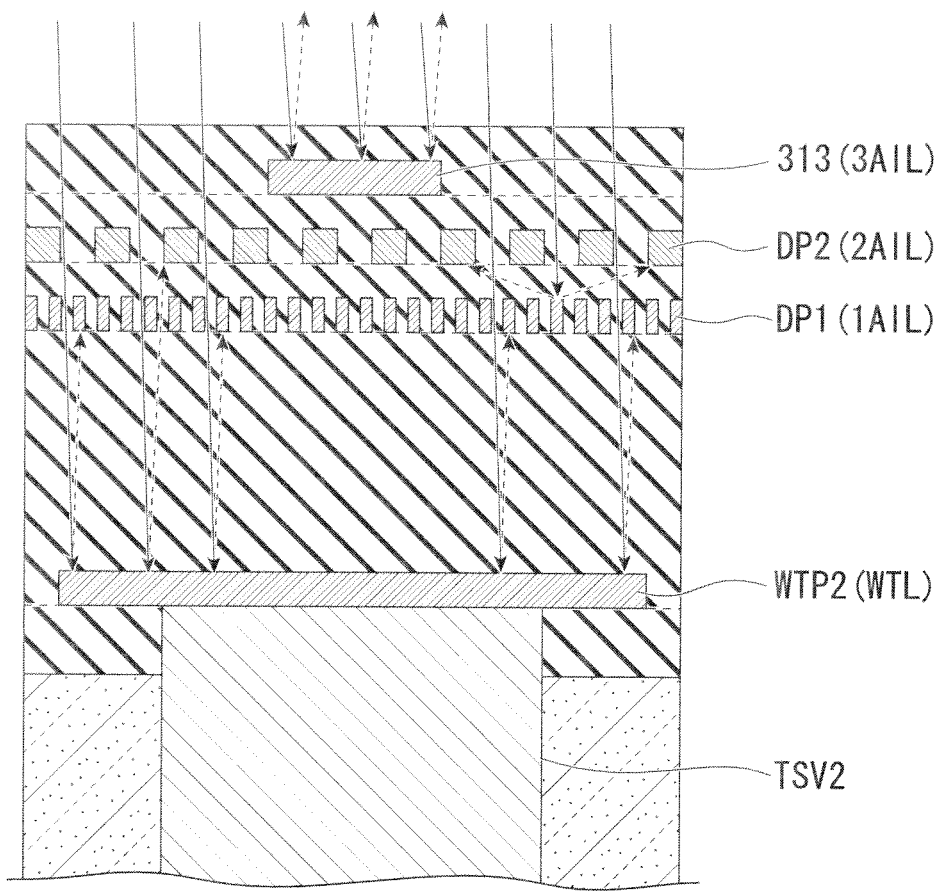
FIG. 5 is a fragmentary cross sectional elevation view of PI opening portion of the memory chip of the semiconductor device of FIG. 1.

FIG. 5 is a cross-sectional view illustrating incident light (a solid line) and reflected light (a dashed line) of lighting in the embodiment of the present invention. Externally illuminated light is transmitted through between the plurality of dummy patterns DP2 as the second aluminum wiring layer 2AIL and the light transmitted through between the plurality of dummy patterns DP2 is divided into light scattered in the plurality of dummy patterns DP1 as the first aluminum wiring layer 1AIL and light transmitted through between the plurality of dummy patterns DP1 as the first aluminum wiring layer 1AIL. The light transmitted through between the plurality of dummy patterns DP1 as the first aluminum wiring layer 1AIL is reflected from the wiring tungsten pad WTP2 including the wiring tungsten layer WTL or scattered in the plurality of dummy patterns DP1 and DP2 as the first aluminum wiring layer 1AIL and the second aluminum wiring layer 2AIL. Thus, reflectance when viewed from the outside is drastically reduced. Since the dummy patterns themselves form a kind of grating, intervals (pitches) between the plurality of dummy patterns DP1 and DP2 different between the first aluminum wiring layer 1AIL and the second aluminum wiring layer 2AIL are more effective in lowering the reflectance of the mark background.

Figure 4D:
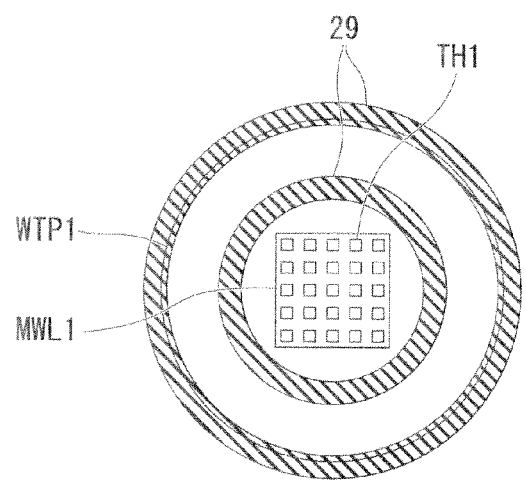
FIG. 4D is a fragmentary cross sectional horizontal view of the memory chip of the semiconductor device of FIG. 1.
Figure 4E:
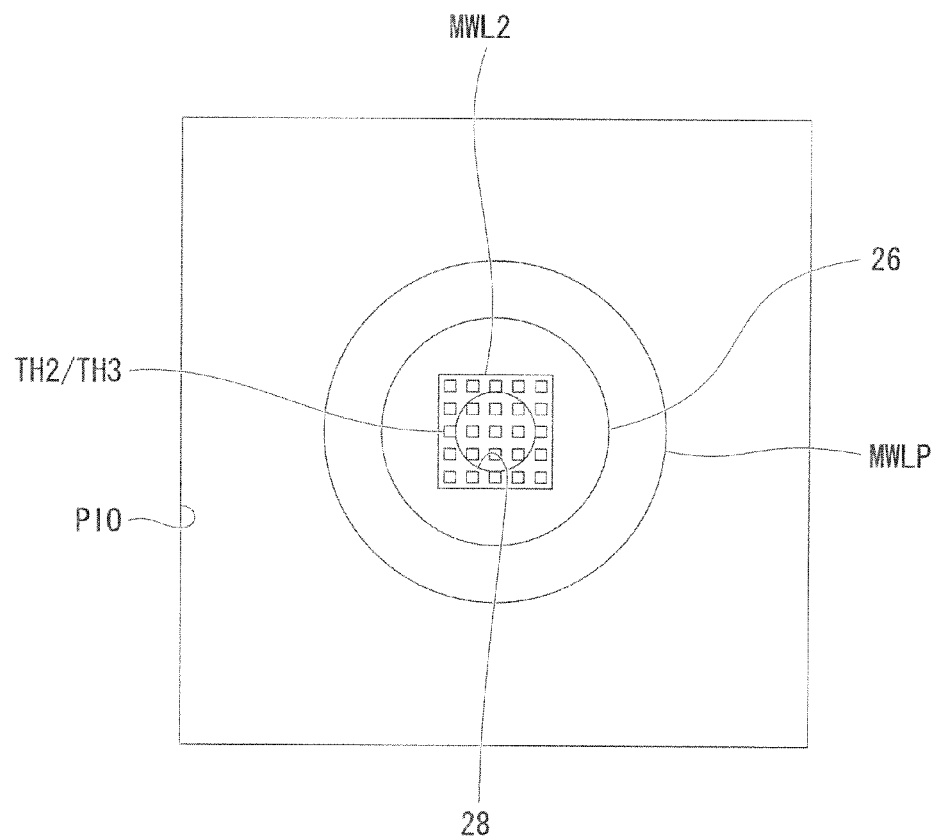
FIG. 4E is a fragmentary cross sectional horizontal view of the memory chip of the semiconductor device of FIG. 1.
Figure 4F:
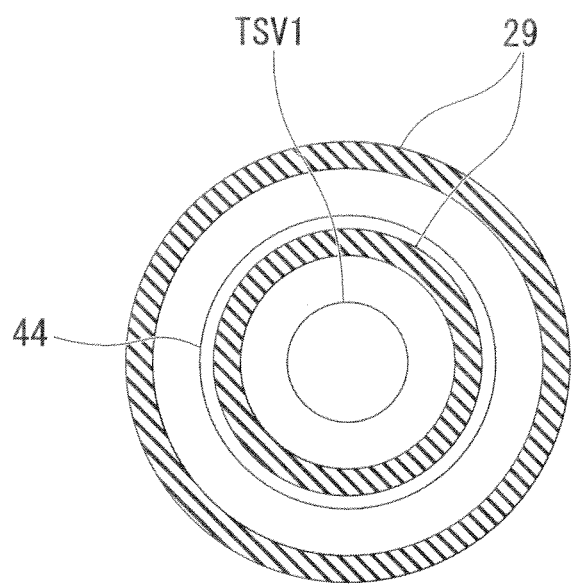
FIG. 4F is a fragmentary cross sectional horizontal view of a dump on the opposite surface of the memory chip of the semiconductor device of FIG. 1.

FIGS. 4D to 4F are plan views when viewed from a surface side and a rear surface side of a portion of the wiring through electrode 42 with comparison to a mark portion. FIG. 4D is a schematic plan view of an underlying layer of the second aluminum wiring layer 2AIL of the wiring through electrode 42 when viewed from the surface side. FIG. 4E is a schematic plan view of an overlying layer of the second aluminum wiring layer 2AIL. FIG. 4F is a schematic plan view of the rear bump 44 when viewed from the rear surface.

When comparing FIGS. 4A and 4B with FIGS. 4C and 4D, FIGS. 4A and 4B show that the wiring tungsten pad WTP2 of the mark portion has a square shape, while FIGS. 4C and 4D show that the wiring tungsten pad WTP1 of the wiring through electrode portion has a circular shape.

As shown in FIGS. 3A and 3B, preferably, a size of the wiring tungsten pad WTP2 of the mark portion may be larger than a size of wiring tungsten pad WTP1 of the wiring through electrode portion. This is because it is necessary for a size of the through electrode TSV2 for a mark shown in FIG. 4C to be larger than that of the wiring through electrode TSV1 to form the rear mark 314 having a significantly large size to be recognized by a camera, or the like.

A method of fabricating the memory chip 31 according to the first embodiment of the present invention will be described. FIGS. 6A to 14 are views for sequentially explaining a method of fabricating the memory chip 31.

Figure 6A:
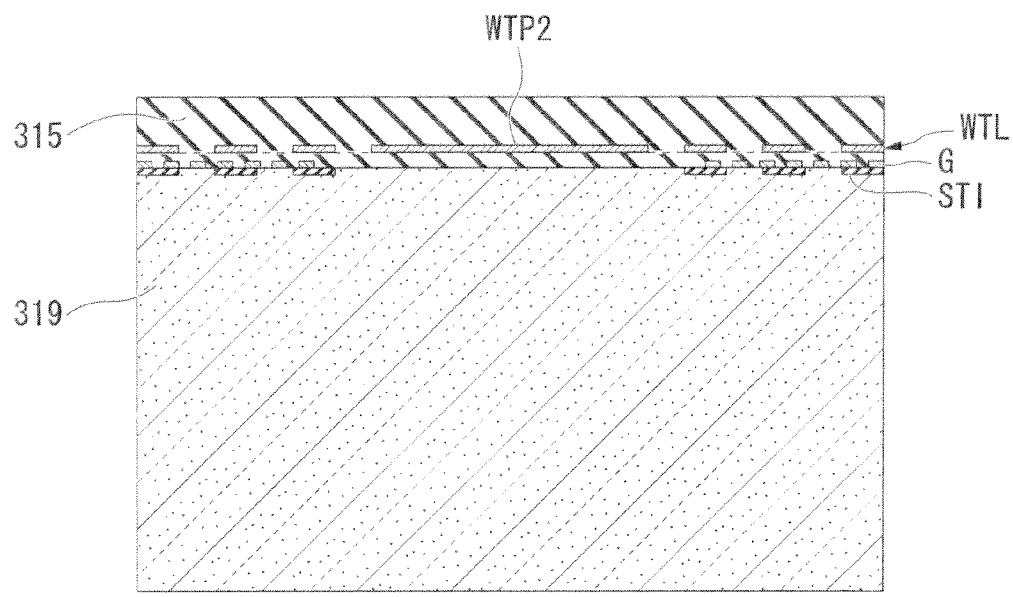
FIG. 6A is a fragmentary cross sectional elevation view of a step involved in a method of forming the memory chip of the semiconductor device of FIG. 1.

First, a fabrication step shown in FIG. 6A shows a state in which a first interlayer insulating layer 315 is formed to cover a wiring tungsten layer WTL (including a wiring tungsten pad WTP2) which is a portion of a multi-layer wiring structure, an active device, and a capacitor on one surface of a semiconductor substrate 319 in a state in which a process of forming the wiring tungsten layer WTL, the active device, and the capacitor on one surface (a surface, a circuit forming surface side) of the semiconductor substrate 319 is completed. Then, forming the multi-layer wiring structure is performed. A via of a first through hole (not shown in FIG. 6A) is formed.

Figure 6B:
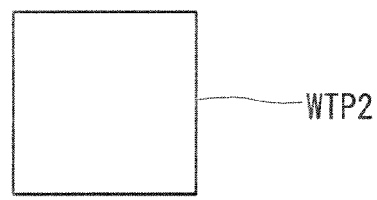
FIG. 6B is a fragmentary cross sectional elevation view of a part of the memory chip in the step of FIG. 6A.

FIG. 6B is a schematic plan view when viewed from the surface of FIG. 6A. The schematic plan views in the description of the fabrication method of this embodiment describe an area corresponding to a portion beneath the opening PIO formed in the polyimide PI shown in FIGS. 4A to 4C. In addition, in the schematic plan views in the description of the fabrication method of this embodiment, interlayer insulating layers will be omitted so that shapes of wiring layers can be easily seen.

Figure 6C:
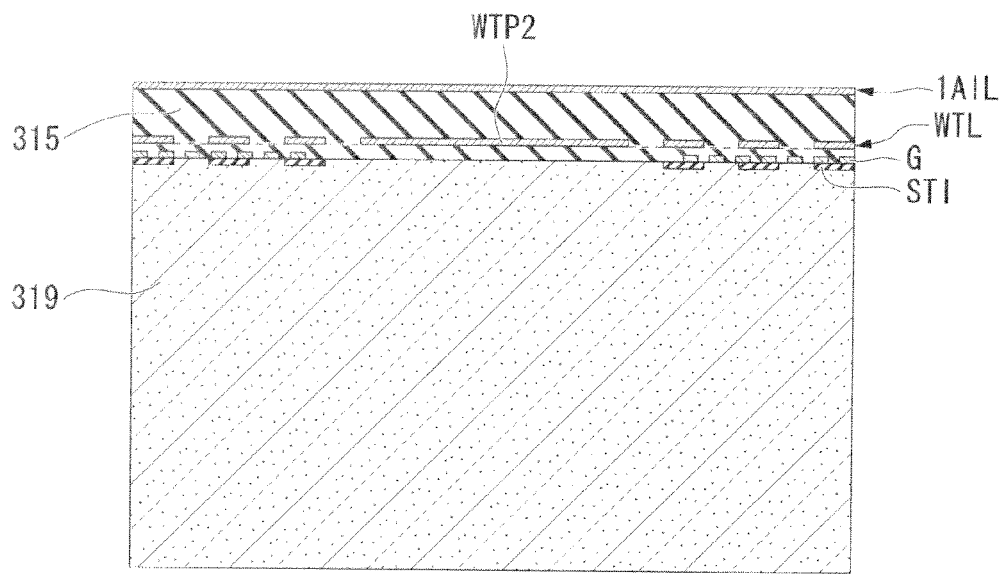
FIG. 6C is a fragmentary cross sectional elevation view of a step, subsequent to the step of FIG. 6A, involved in the method of forming the memory chip of the semiconductor device of FIG. 1.

A fabrication step shown in FIG. 6C shows a growth process of a first aluminum wiring layer 1AIL, and a stacked metal layer including a barrier metal, aluminum, an anti-reflection layer, and the like is grown on a first interlayer insulating layer 315 by a sputtering method, or the like.

Figure 7A:
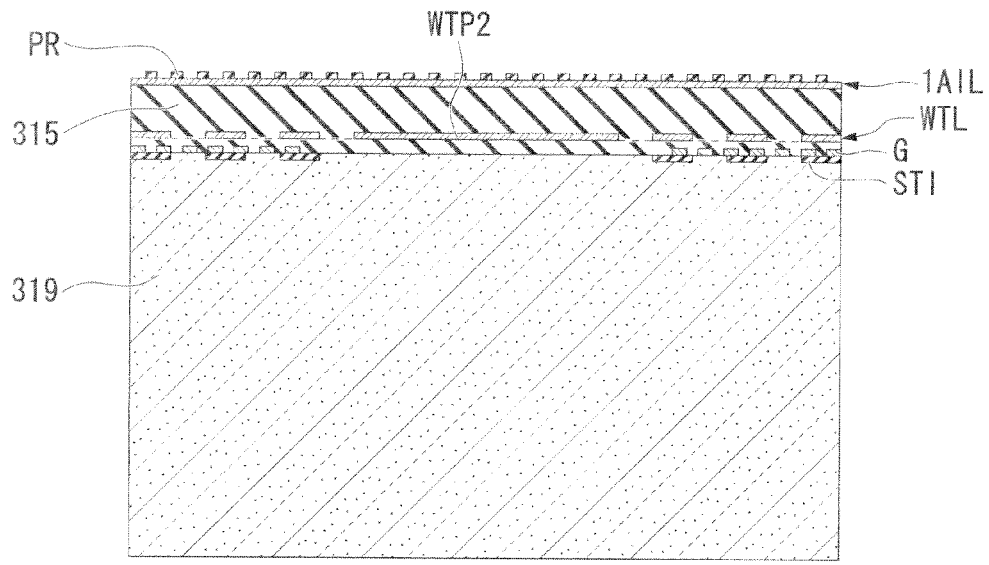
FIG. 7A is a fragmentary cross sectional elevation view of a step, subsequent to the step of FIG. 6C, involved in the method of forming the memory chip of the semiconductor device of FIG. 1.

In a fabrication step of FIG. 7A, a photoresist PR is coated on the stacked metal layer by coating and a pattern is formed using a reticle, or the like. Next, in a fabrication step of FIG. 7B, the stacked metal layer is dry-etched using the photoresist PR as a mask to form a first aluminum wiring layer 1AIL. In this case, a first dummy pattern DP1 is formed in an area including a portion beneath the area in which the surface mark 313 is formed (including an area on the wiring tungsten pad WTP2 of FIG. 7B). A second interlayer insulating layer 316 is formed on the first dummy pattern DP1 to cover the first aluminum wiring layer 1AIL including the first dummy pattern DP1. The insulating layer is an oxide layer such as $SiO_2$. A via of a second through hole (not shown in FIG. 7B) is formed.

Figure 7B:
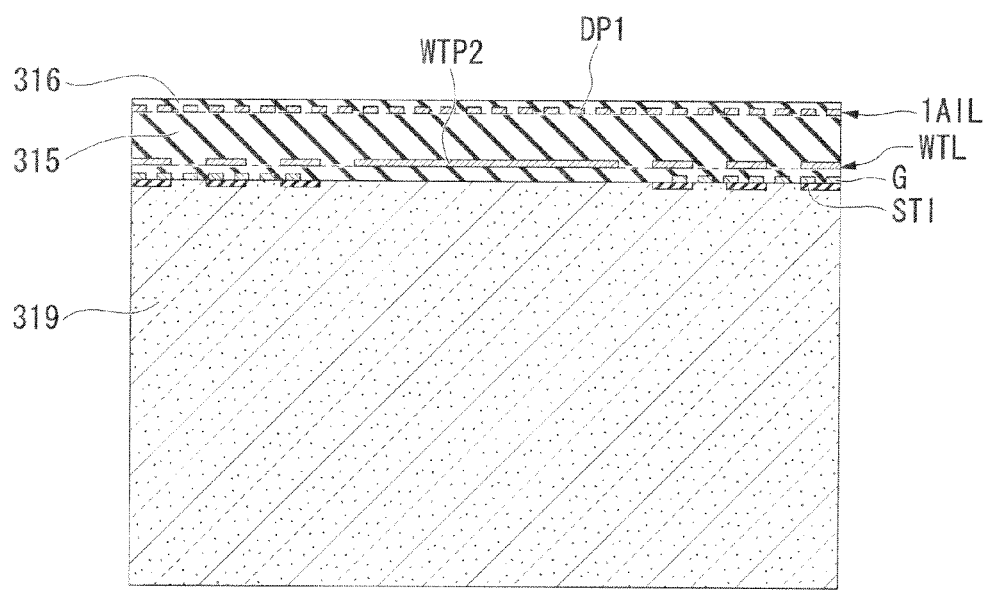
FIG. 7B is a fragmentary cross sectional elevation view of a step, subsequent to the step of FIG. 7A, involved in the method of forming the memory chip of the semiconductor device of FIG. 1.
Figure 7C:
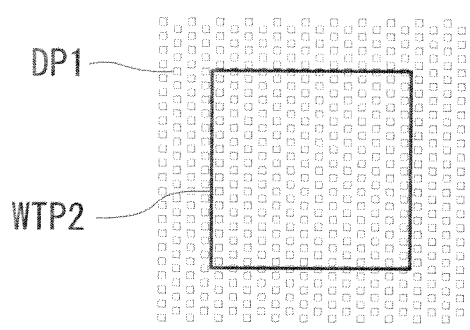
FIG. 7C is a fragmentary cross sectional elevation view of a part of the memory chip in the step of FIG. 7B.

FIG. 7C is a schematic plan view when viewed from the surface of FIG. 7B. In the area including a portion on the wiring tungsten pad WTP2 formed in the wiring tungsten layer WTL, a plurality of first dummy patterns DP1 formed in the first aluminum wiring layer 1AIL are formed.

Figure 8A:
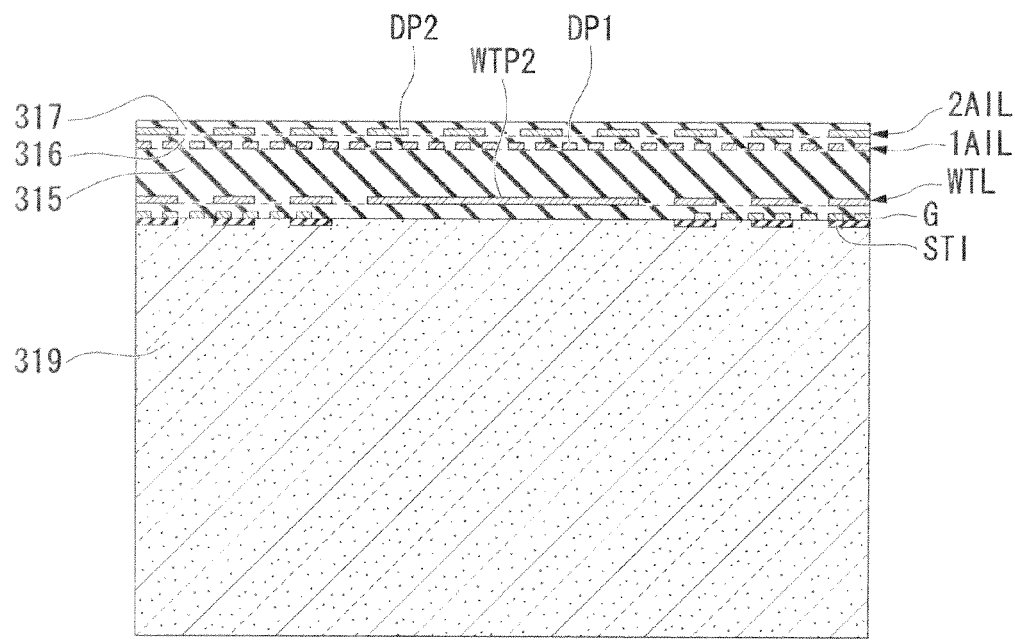
FIG. 8A is a fragmentary cross sectional elevation view of a step, subsequent to the step of FIG. 7B, involved in the method of forming the memory chip of the semiconductor device of FIG. 1.

In a fabrication step of FIG. 8A, a pattern of a second aluminum wiring layer 2AIL is formed and a third interlayer insulating layer 317 is formed. The process is the same as the process of forming the first aluminum wiring layer 1AIL. A plurality of second dummy patterns DP2 are formed in an area on the second interlayer insulating layer 316 including the portion beneath the area in which the surface mark 313 is formed. The insulating layer is an oxide layer such a $SiO_2$. A third interlayer insulating layer 317 is formed to cover the second aluminum wiring layer 2AIL including the plurality of second dummy patterns DP2. A via of a third through hole (not shown in FIG. 8A) is formed.

Figure 8B:
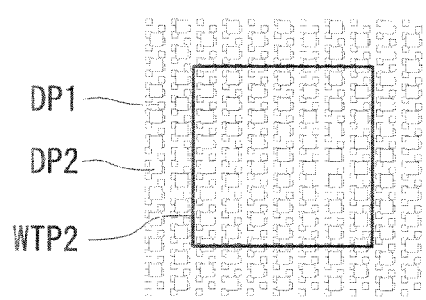
FIG. 8B is a fragmentary cross sectional elevation view of a part of the memory chip in the step of FIG. 8A.

FIG. 8B is a schematic plan view when viewed from the surface of FIG. 8A. In an area including a portion on the wiring tungsten pad WTP2 formed in the wiring tungsten layer WTL, the plurality of second dummy patterns DP2 formed in the second aluminum wiring layer 2AIL are formed.

Figure 8C:
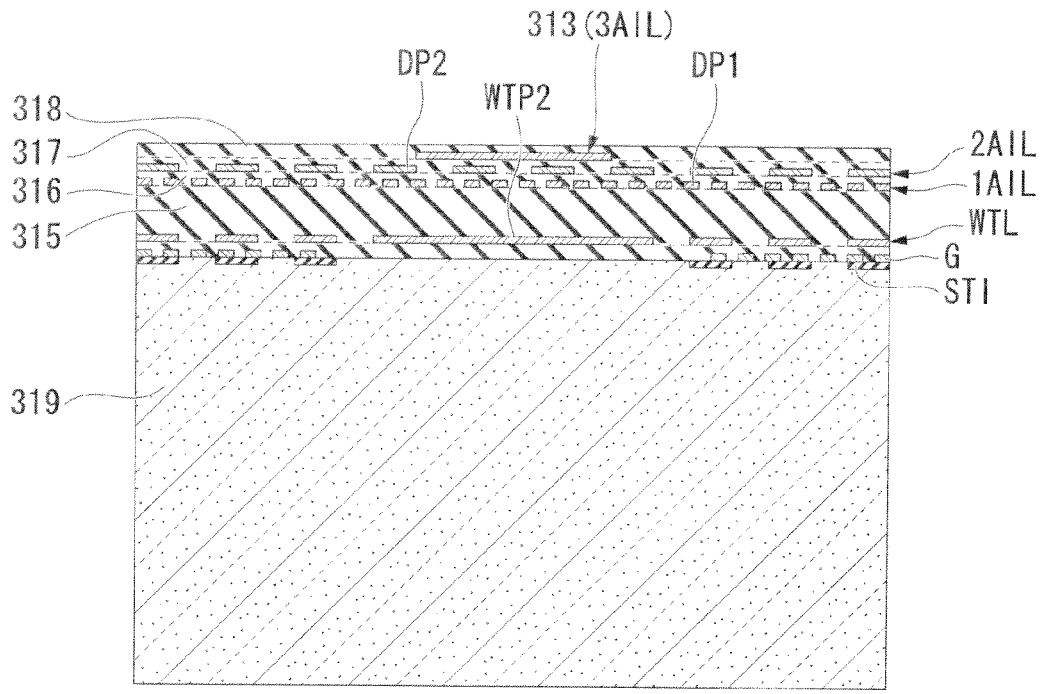
FIG. 8C is a fragmentary cross sectional elevation view of a step, subsequent to the step of FIG. 8A, involved in the method of forming the memory chip of the semiconductor device of FIG. 1.

In a fabrication step of FIG. 8C, a third aluminum wiring layer 3AIL including the surface mark 313 is formed on the third interlayer insulating layer 317. A fourth interlayer insulating layer 318 is formed to cover the third aluminum wiring layer 3AIL. The fourth interlayer insulating layer 318 is referred to as a passivation layer and includes a nitride layer such as dense $Si_3N_4$ or an oxynitride layer such as SiON to prevent moisture to penetrate.

Figure 8D:
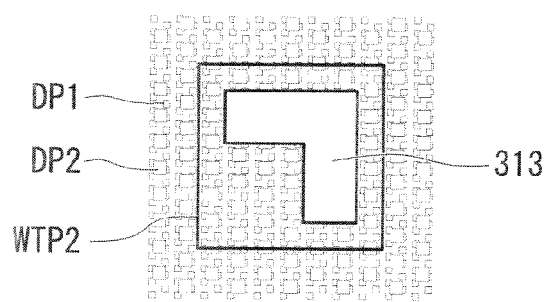
FIG. 8D is a fragmentary cross sectional elevation view of a part of the memory chip in the step of FIG. 8C.

FIG. 8D is a schematic plan view when viewed from the surface of FIG. 8C. In the area including the portion on the wiring tungsten pad WTP2 formed in the wiring tungsten layer WTL, the surface mark 313 having an L shape formed in the third aluminum wiring layer 3AIL is formed. As shown in FIGS. 7C and 8A, in this embodiment, the first and second dummy patterns DP1 and DP2 are also formed below the surface mark 313.

Figure 9A:
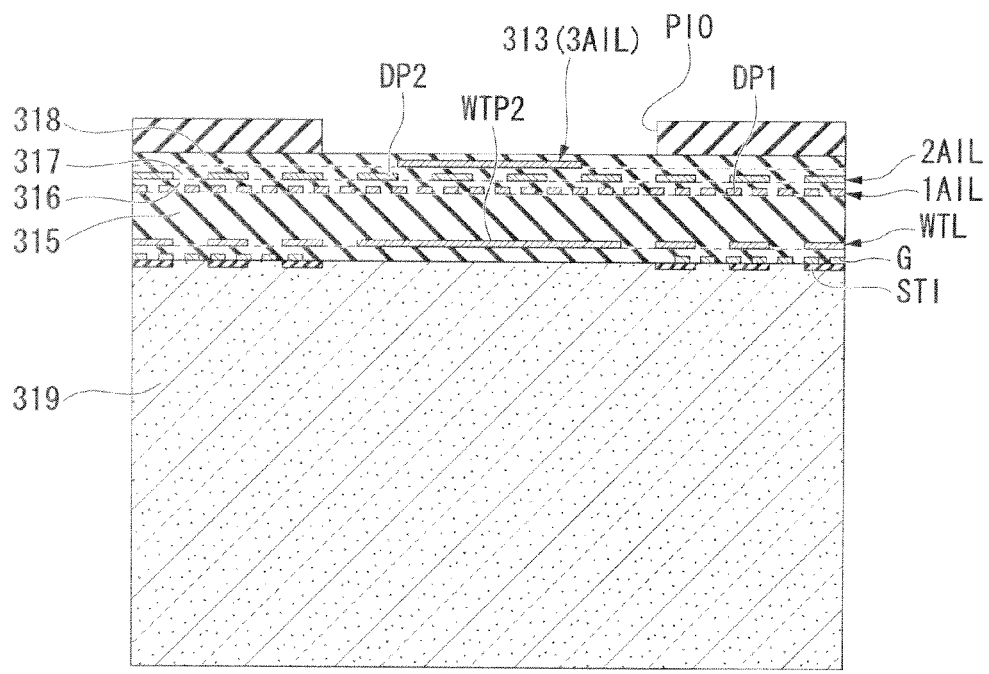
FIG. 9A is a fragmentary cross sectional elevation view of a step, subsequent to the step of FIG. 8C, involved in the method of forming the memory chip of the semiconductor device of FIG. 1.

In a fabrication step of FIG. 9A, a polyimide film PI, which is a resin layer, is formed on the fourth interlayer insulating layer 318 and an opening PIO is formed in the formed polyimide film PI to expose the surface mark 313 and a portion of the fourth interlayer insulating layer 318 covering the surface mark 313.

Figure 9B:
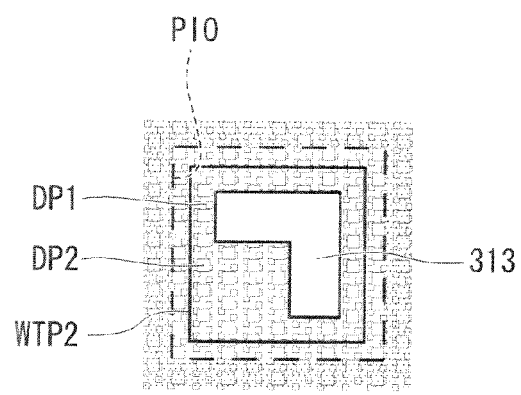
FIG. 9B is a fragmentary cross sectional elevation view of a part of the memory chip in the step of FIG. 9A.

FIG. 9B is a schematic plan view when viewed from the surface of FIG. 9A. The opening PIO formed in the polyimide film PI is formed in an upper area in which the surface mark 313, portions of the plurality of second dummy patterns DP2, portions of the plurality of first dummy patterns DP1, and the wiring tungsten pad WTP2 are formed.

Figure 9C:
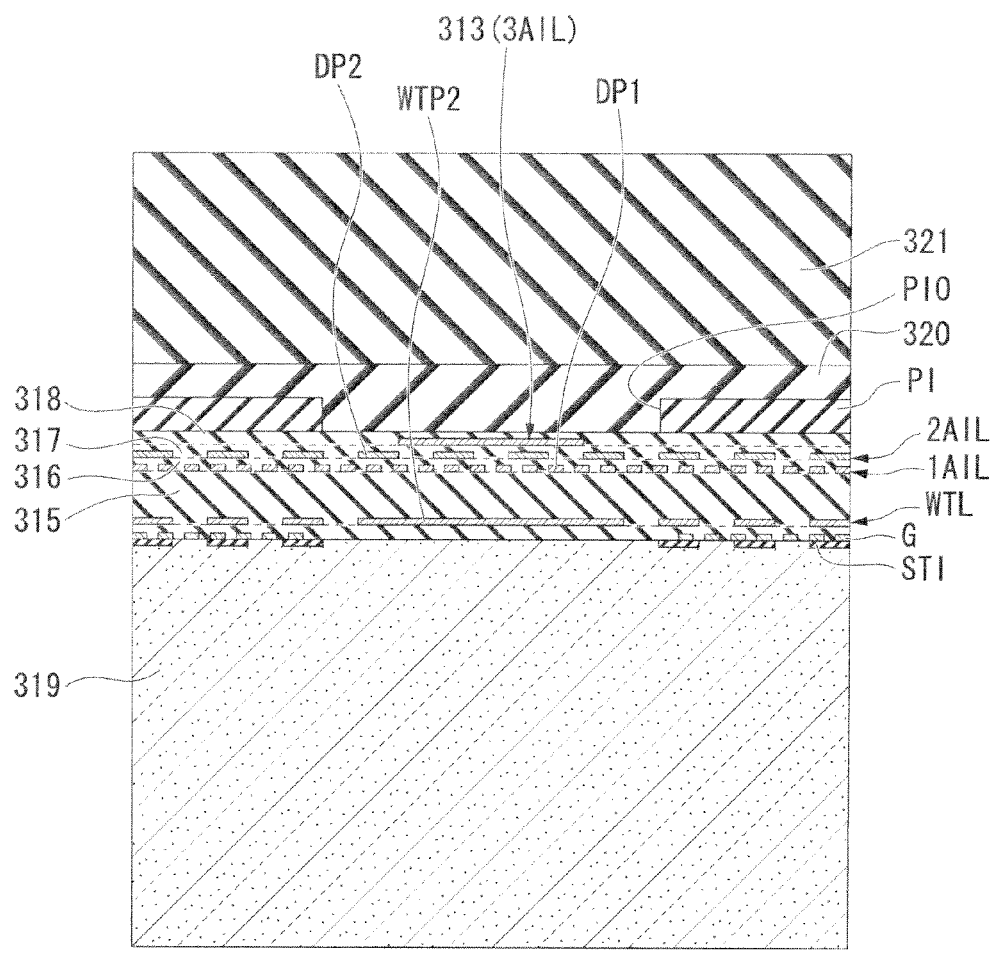
FIG. 9C is a fragmentary cross sectional elevation view of a step, subsequent to the step of FIG. 9A, involved in the method of forming the memory chip of the semiconductor device of FIG. 1.

In fabrication step of FIG. 9C, a wafer support system (WSS) 321 formed of $SiO_2$ or the like is attached to a wafer surface in which a wiring process up to a process of forming the surface bump is completed by an adhesive 320. An adhesive capable of being peeled off from the wafer by ultraviolet light or the like is used as the adhesive 320.

Figure 10A:
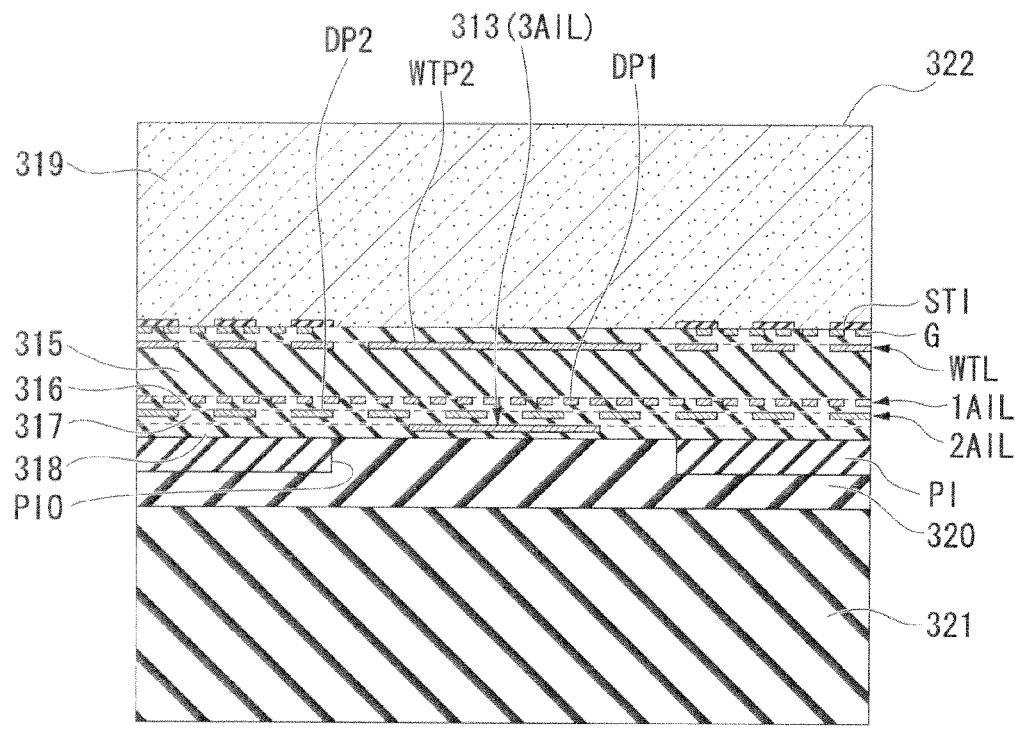
FIG. 10A is a fragmentary cross sectional elevation view of a step, subsequent to the step of FIG. 9C, involved in the method of forming the memory chip of the semiconductor device of FIG. 1.

In a fabrication step of FIG. 10A, a rear surface of the wafer is ground to be thinned to about 50 to 20 μm. An insulating layer 322 including a nitride layer such as $Si_3N_4$ is formed on the rear surface to prevent the rear surface from being polluted with metal. For clarity, tops and bottoms of the wafers are upside down from FIG. 10A to process the rear surface from this step.

Figure 10B:
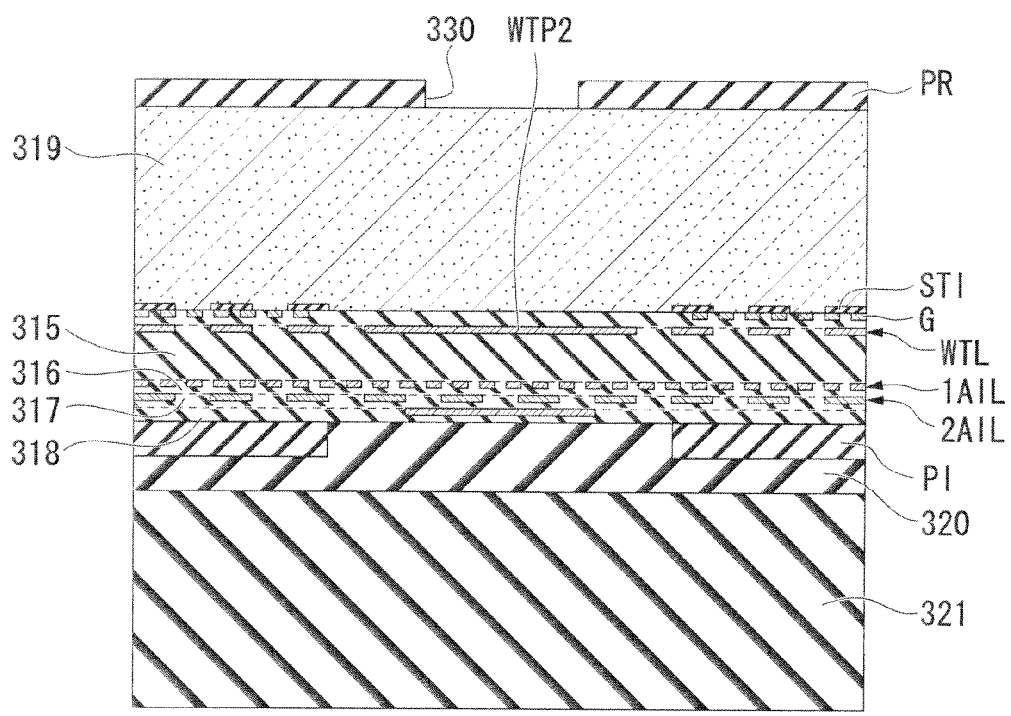
FIG. 10B is a fragmentary cross sectional elevation view of a step, subsequent to the step of FIG. 10A, involved in the method of forming the memory chip of the semiconductor device of FIG. 1.

In a fabrication step of FIG. 10B, to form a through electrode TSV2 for a mark, a photoresist PR is coated to form an opening pattern 330.

Figure 11A:
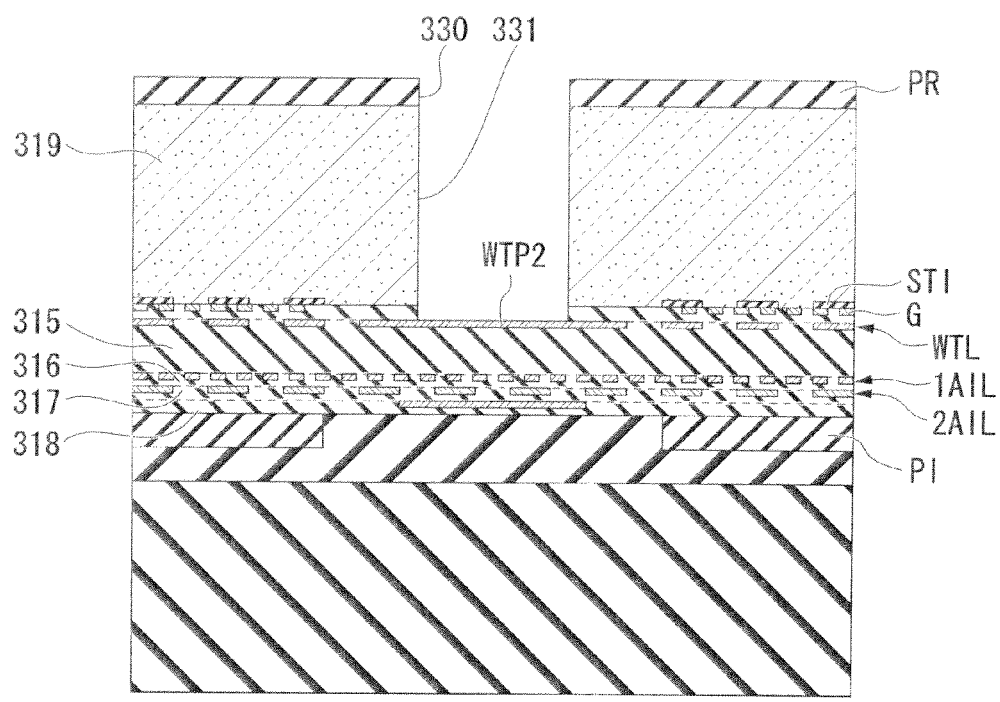
FIG. 11A is a fragmentary cross sectional elevation view of a step, subsequent to the step of FIG. 10B, involved in the method of forming the memory chip of the semiconductor device of FIG. 1.

In a fabrication step of FIG. 11A, a dry etching process is performed using the photoresist PR as a mask to form an opening 331 of the through electrode TSV2 for a mark up to the wiring tungsten pad WTP2.

Figure 11B:
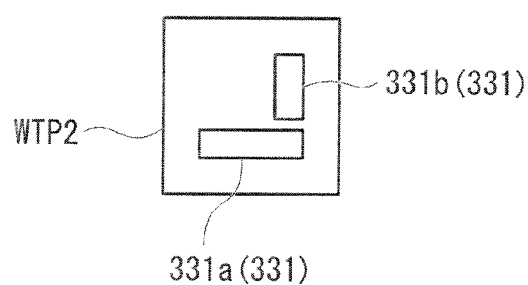
FIG. 11B is a fragmentary cross sectional elevation view of a part of the memory chip in the step of FIG. 11A.

FIG. 11B is a schematic plan view when viewed from the rear surface side of FIG. 11A, and square-shaped openings 331a and 331b are formed by the dry etching process.

Figure 11C:
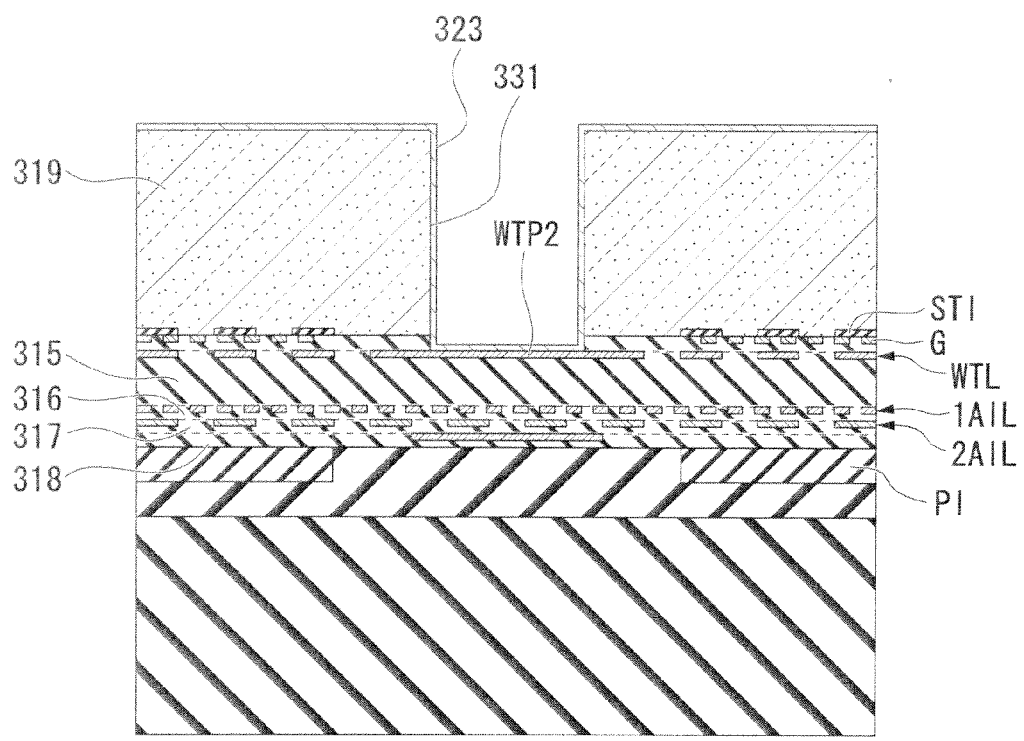
FIG. 11C is a fragmentary cross sectional elevation view of a step, subsequent to the step of FIG. 11A, involved in the method of forming the memory chip of the semiconductor device of FIG. 1.

In a fabrication step of FIG. 11C, after removing the photoresist PR, a seed layer 323 such as Ti/Cu is formed using a sputter on the entire rear surface of the wafer including a sidewall of the opening 331 (331a, 331b) and a portion on the wiring tungsten pad WTP2 of a bottom of the through electrode TSV2 for a mark.

Figure 12A:
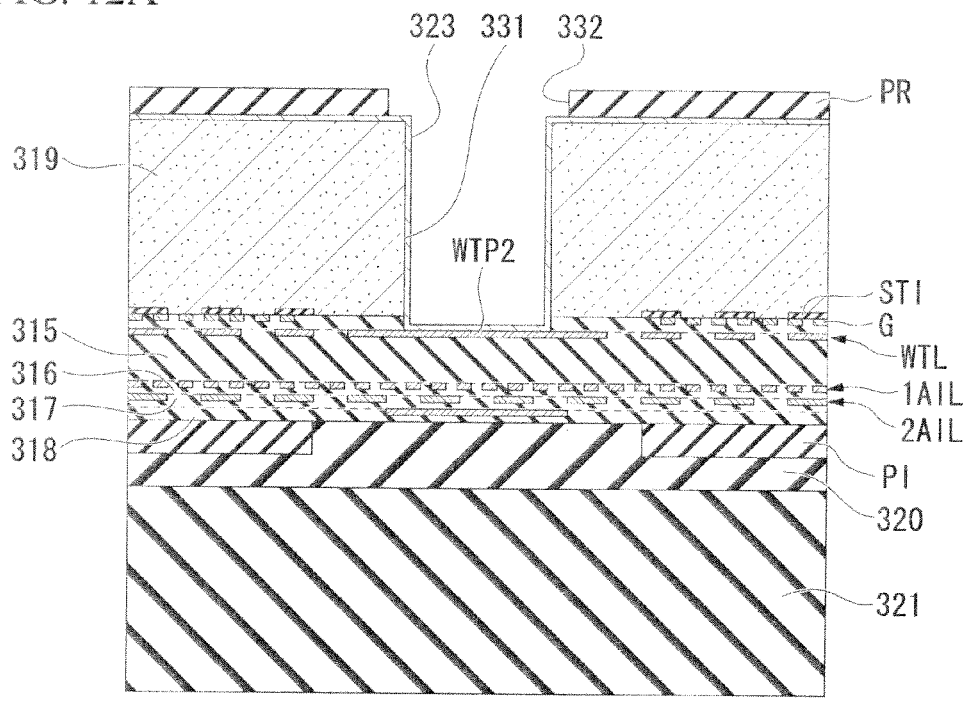
FIG. 12A is a fragmentary cross sectional elevation view of a step, subsequent to the step of FIG. 11C, involved in the method of forming the memory chip of the semiconductor device of FIG. 1.

In a fabrication step of FIG. 12A, to form a rear bump electrode 312 including the rear mark 314, the photoresist PR is coated to form an opening pattern 332.

Figure 12B:
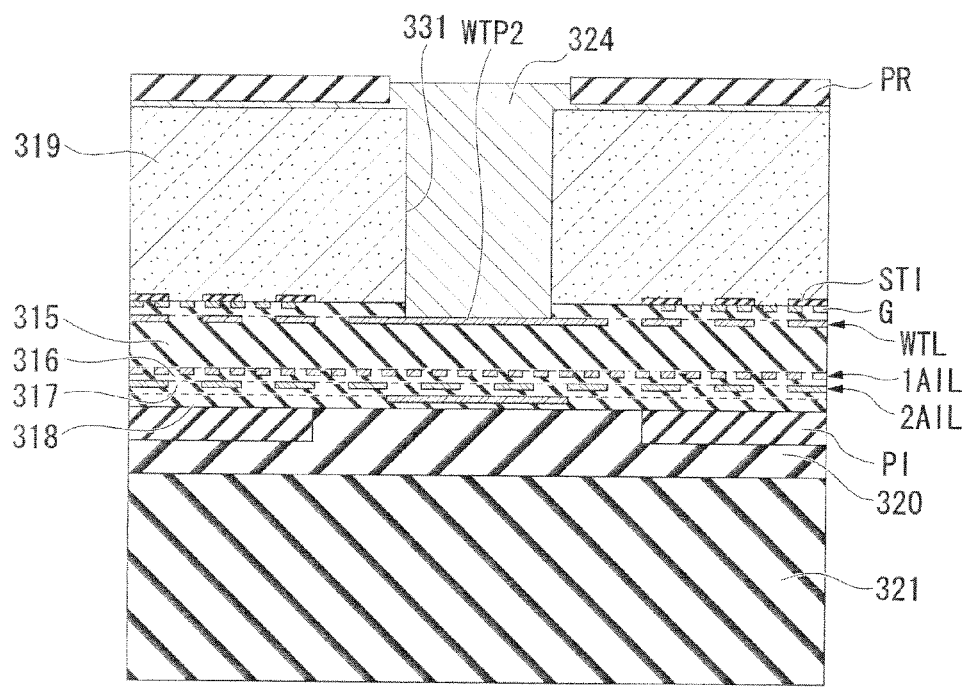
FIG. 12B is a fragmentary cross sectional elevation view of a step, subsequent to the step of FIG. 12A, involved in the method of forming the memory chip of the semiconductor device of FIG. 1.

In a fabrication step of FIG. 12B, a Cu plating 324 is grown using a seed layer 323 as an electrode to fill a via of the through electrode TSV2 for a mark and form a pillar of the rear bump electrode 312.

Figure 13A:
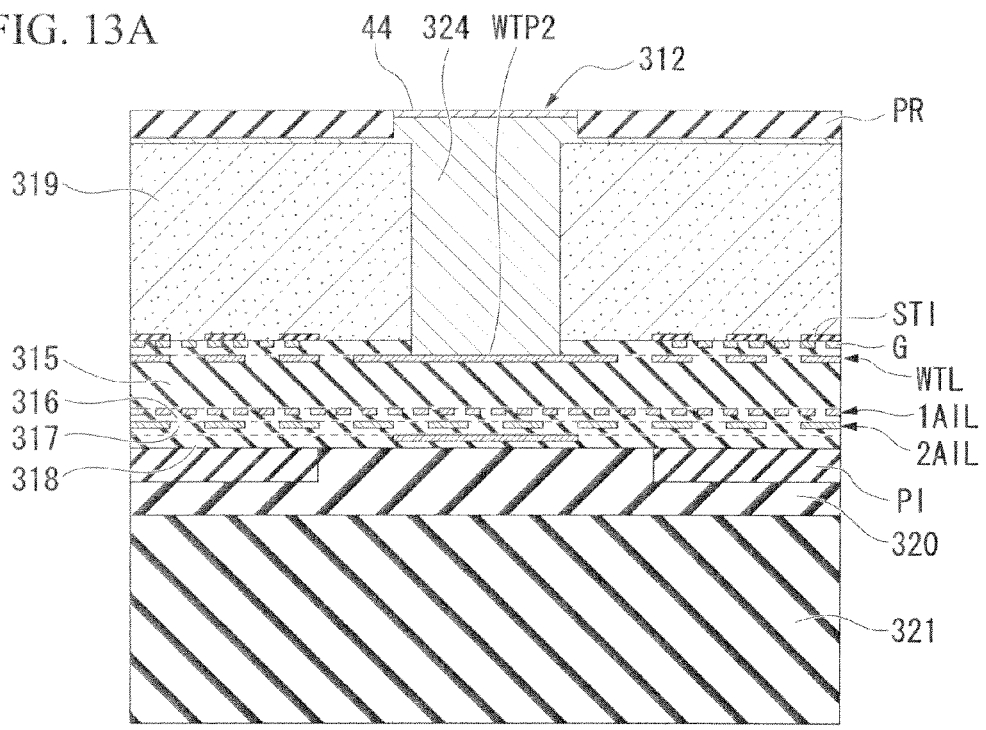
FIG. 13A is a fragmentary cross sectional elevation view of a step, subsequent to the step of FIG. 12B, involved in the method of forming the memory chip of the semiconductor device of FIG. 1.

In a fabrication step of FIG. 13A, SnAg is formed as the rear bump electrode 312 including the rear bump 44 by plating.

Figure 13B:
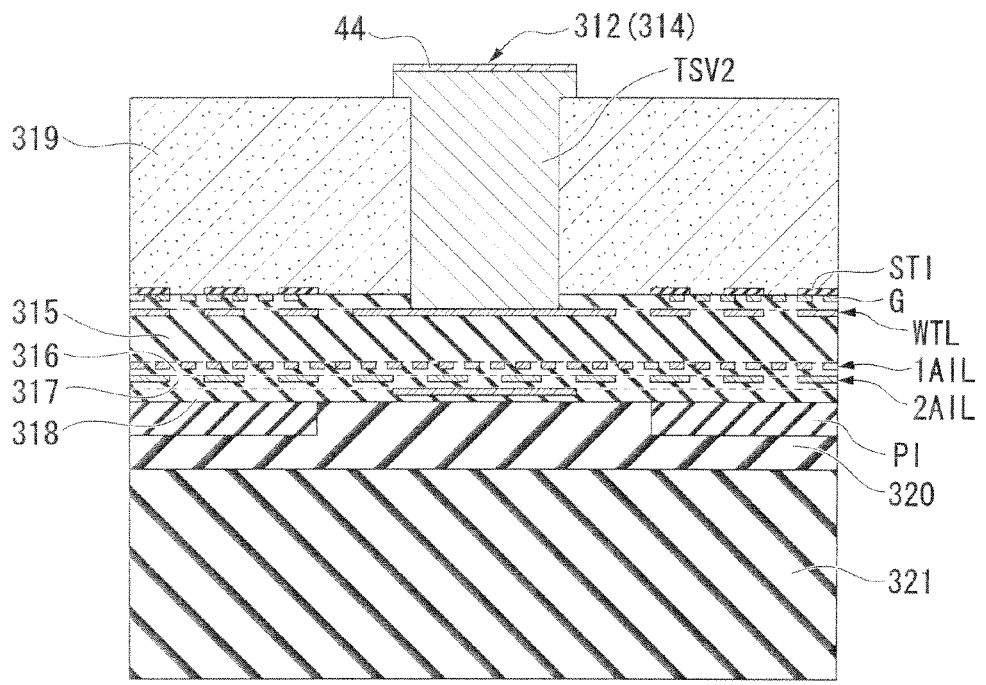
FIG. 13B is a fragmentary cross sectional elevation view of a step, subsequent to the step of FIG. 13A, involved in the method of forming the memory chip of the semiconductor device of FIG. 1.

In a fabrication step of FIG. 13B, the photoresist PR is removed and the seed layer 323 is further removed by a wet etching method, or the like.

Figure 13C:
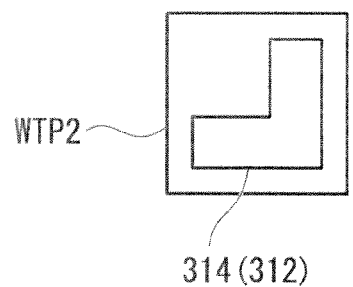
FIG. 13C is a fragmentary cross sectional elevation view of a part of the memory chip in the step of FIG. 13B.
Figure 14:
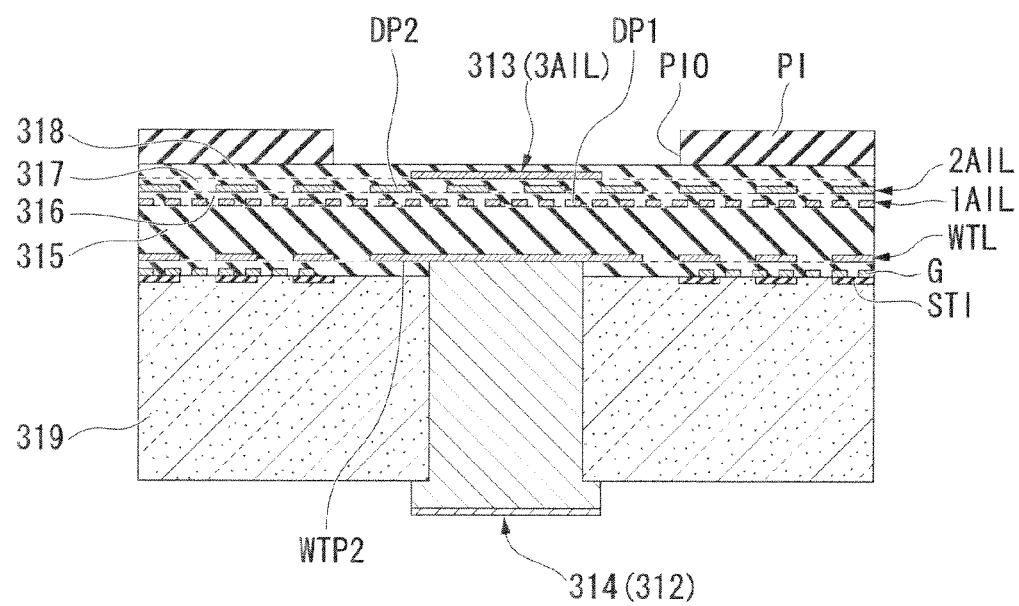
FIG. 14 is a fragmentary cross sectional elevation view of a step, subsequent to the step of FIG. 13B, involved in the method of forming the memory chip of the semiconductor device of FIG. 1.

FIG. 13C is a schematic plan view when viewed from the rear surface side of FIG. 13B. The rear mark 314 having an L shape is formed. Next, in a fabrication step of FIG. 14, the wafer is demounted from the support system 321 by ultraviolet light.

Figure 15A:
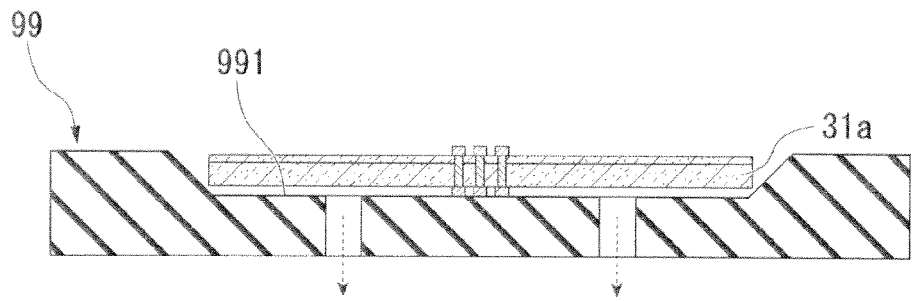
FIG. 15A is a fragmentary cross sectional elevation view of a step involved in a method of stacking semiconductor chips to form the semiconductor device of FIG. 1.
Figure 15B:
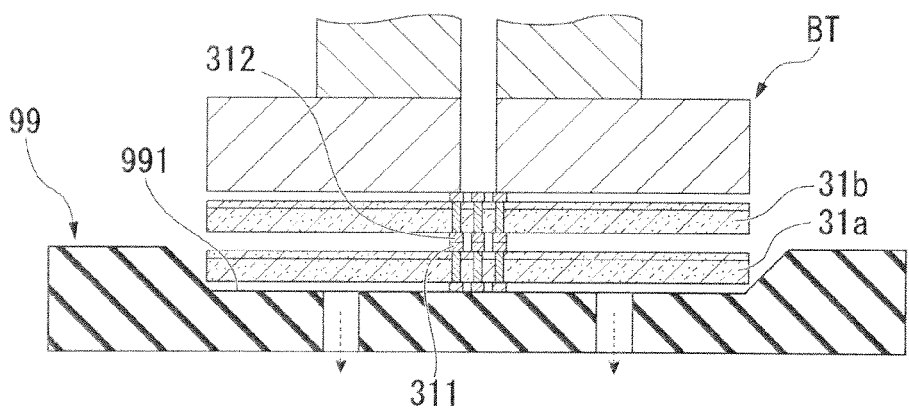
FIG. 15B is a fragmentary cross sectional elevation view of a step, subsequent to the step of FIG. 15A, involved in the method of stacking semiconductor chips to form the semiconductor device of FIG. 1.
Figure 15C:
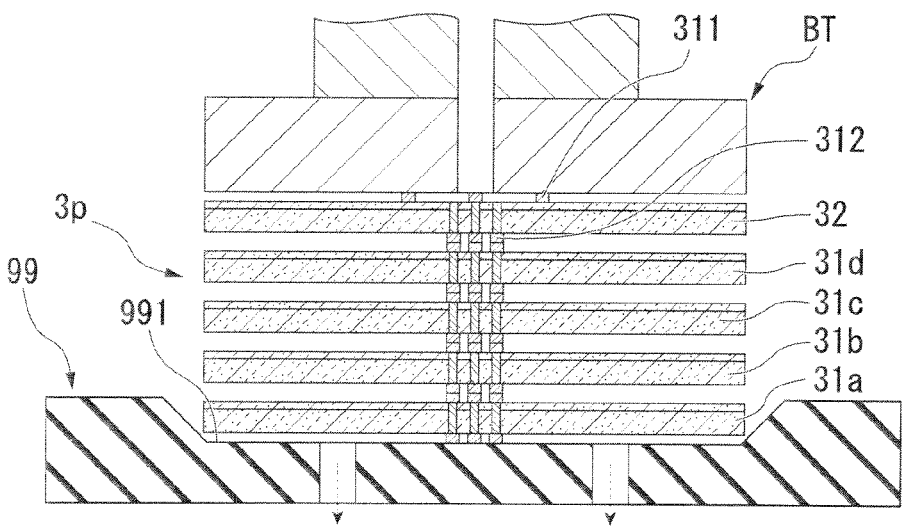
FIG. 15C is a fragmentary cross sectional elevation view of a step, subsequent to the step of FIG. 15B, involved in the method of stacking semiconductor chips to form the semiconductor device of FIG. 1.

Next, an assembly process of the semiconductor device 1 shown in FIG. 1 will be described. FIG. 15A to FIG. 15C are views for explaining the assembly process.

As shown in FIG. 15A, a recess unit 991 is formed in an adsorption level 99 and a memory chip (a first-level semiconductor chip) 31a is placed within the recess unit 991 to face a circuit-forming surface upward. The memory chip 31a placed on the adsorption level 99 is held and fixed through vacuum suction by a vacuum apparatus (not shown).

As shown in FIG. 15B, a memory chip (a second-level semiconductor chip) 31b is stacked and mounted on the memory chip 31a held on the adsorption level 99 as described above through a bonding tool BT by applying weight at a high temperature, for example, about 300° C.

In this case, to align stack positions of the memory chips 31a and 31b, the surface mark 313 of the memory chip 31a disposed on the adsorption level 99 is photographed by a substrate-side recognition camera of a flip chip bonder and a coordinate of the memory chip 31a on the level is recognized. The rear mark 314 of the memory chip 31b picked up by a tool of the flip chip bonder is photographed by a part-side recognition camera of the flip chip bonder and a coordinate of the memory chip 31b on the tool is recognized. According to the obtained position information, a position of the tool is adjusted with respect to the level and the memory chip 31b is stacked and mounted so that the surface bump electrode 311 of the memory chip 31a and the rear bump electrode 312 of the memory chip 31b accurately overlap.

The memory chip 31b has the same type as the memory chip 31a and the surface bump electrode 311 of one surface of the memory chip 31a and the corresponding rear bump electrode 312 of the other surface of the memory chip 31b are electrically connected by thermo-composition so that the memory chip 31b is stacked and mounted on one surface side of the memory chip 31a. As described above, the memory chips are connected by the bump electrodes and thus a gap is formed between the memory chips.

Similarly, memory chips (third- and fourth-level semiconductor chips) 31c and 31d, and an interface chip (a fifth-level semiconductor chip) 32 are stacked and mounted and as shown in FIG. 15C, for example, a chip stacked body 3, in which the four memory chips 31a to 31d and the interface chip 32 are stacked, is formed.

In the interface chip the rear bump electrode 312 of the other surface side is arranged to correspond to the surface bump electrode 311 of the memory chip 31d and the surface bump electrode 311 of the surface side is arranged in a wide pitch of about 60 to 200 μm to be mounted on the connection pad 23 of the wiring board 2.

Then, an underfill is inserted and formed between the chips, and the chip stacked body 3 is mounted on the wiring board 2 and the solder ball 8 is attached in an assembly process, resulting in the semiconductor device 1 shown in FIG. 1.

In the semiconductor device of the present invention, as described above, since the first aluminum wiring layer 1AIL and the second aluminum wiring layer 2AIL located below the surface mark 313 of the memory chip 31 (31a to 31d) form the dummy patterns DP1 and DP2 having sizes smaller than resolution of the recognition camera, that is, sizes which are not recognized by the recognition camera, it is possible to recognize the surface mark 313 with high contrast in the assembly process as compared to the related art. Here, in particular, the semiconductor device is noticeably characterized in that degradation in the contrast of the surface mark 313 is suppressed without adding a new process.

As described above, when the degradation in the contrast of the surface mark 313 is suppressed and the surface mark is easily recognized, the chips are easily aligned in the assembly process shown in FIGS. 15A to 15C.

In particular, like a chip for TSV stack, it is effective when it is necessary to arrange the wiring tungsten pad WTP below the surface mark 313.

Second Embodiment

A memory chip of a second embodiment of the present invention will be described.

The configurations of the semiconductor device is the same as that of the semiconductor device 1 shown in FIG. 1.

Figure 16:
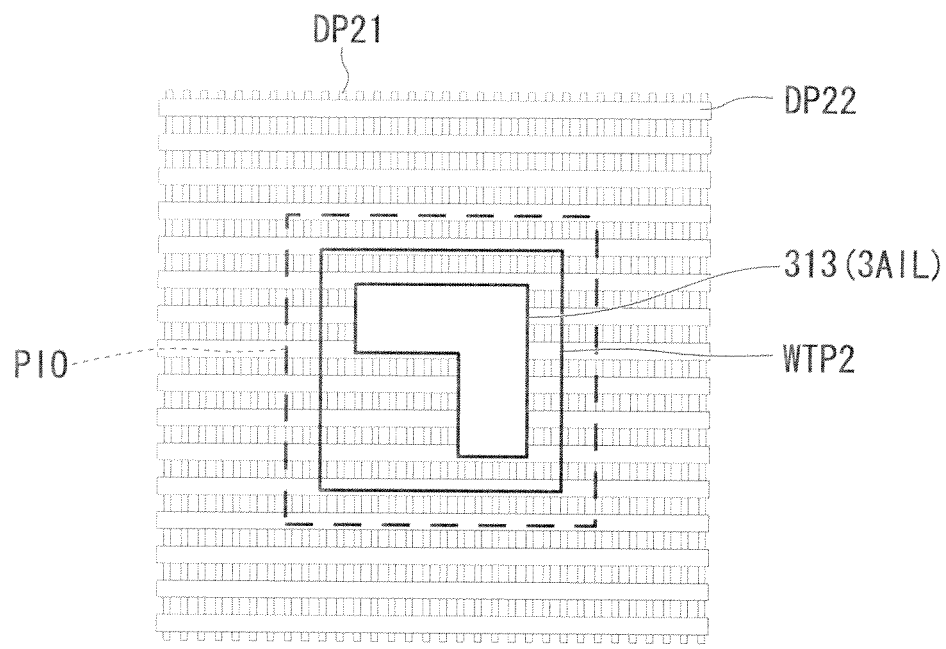
FIG. 16 is a fragmentary plan view of a dummy pattern of a memory chip in a second embodiment of the present invention.

The second embodiment is different from the first embodiment in that the CMP dummy patterns DP1 and DP2 are employed in the first embodiment shown in FIG. 4B, while stripe-shaped patterns DP21 and DP22 are arranged as shown in FIG. 16 in the second embodiment in place of the CMP dummy patterns.

The second embodiment is the same as the first embodiment in that pitches of the stripe-shaped dummy patterns DP21 and DP22 are made to be different in each wiring layer.

Third Embodiment

A third embodiment of the semiconductor device of the present invention will be described.

The entire configuration of the semiconductor device is the same as that of the semiconductor device 1 shown in FIG. 1.

Figure 17:
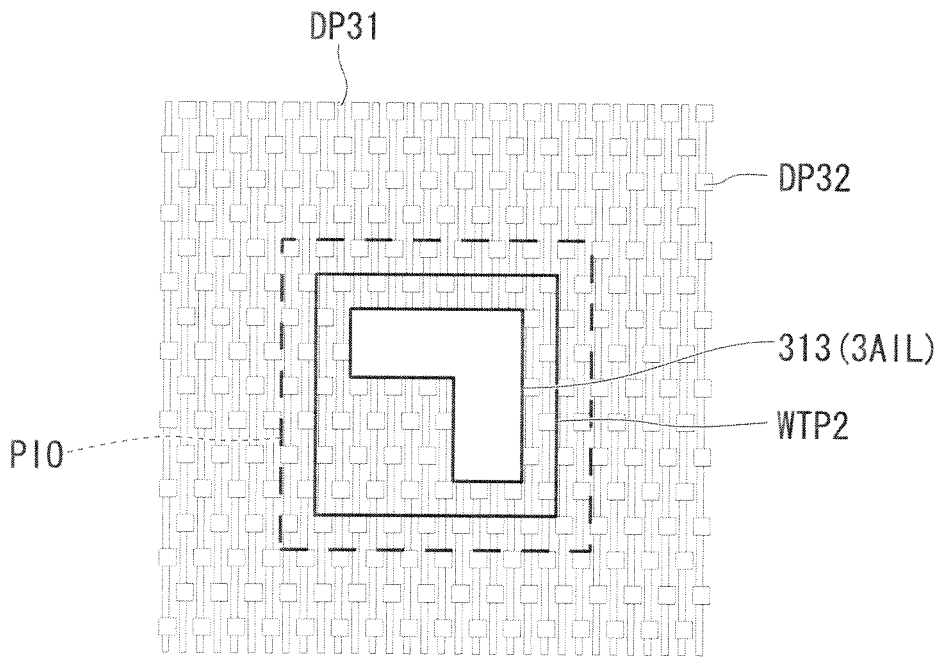
FIG. 17 is a fragmentary plan view of a dummy pattern of a memory chip in a third embodiment of the present invention.

The third embodiment is different from the first embodiment in that the CMP dummy patterns DP1 and DP2 are employed in the first embodiment shown in FIG. 4B, while stripe-shaped patterns DP31 and dummy patterns of dot patterns DP32 are mixed and arranged as shown in FIG. 17 in the third embodiment in place of the CMP dummy patterns.

Modifications

Figure 18:
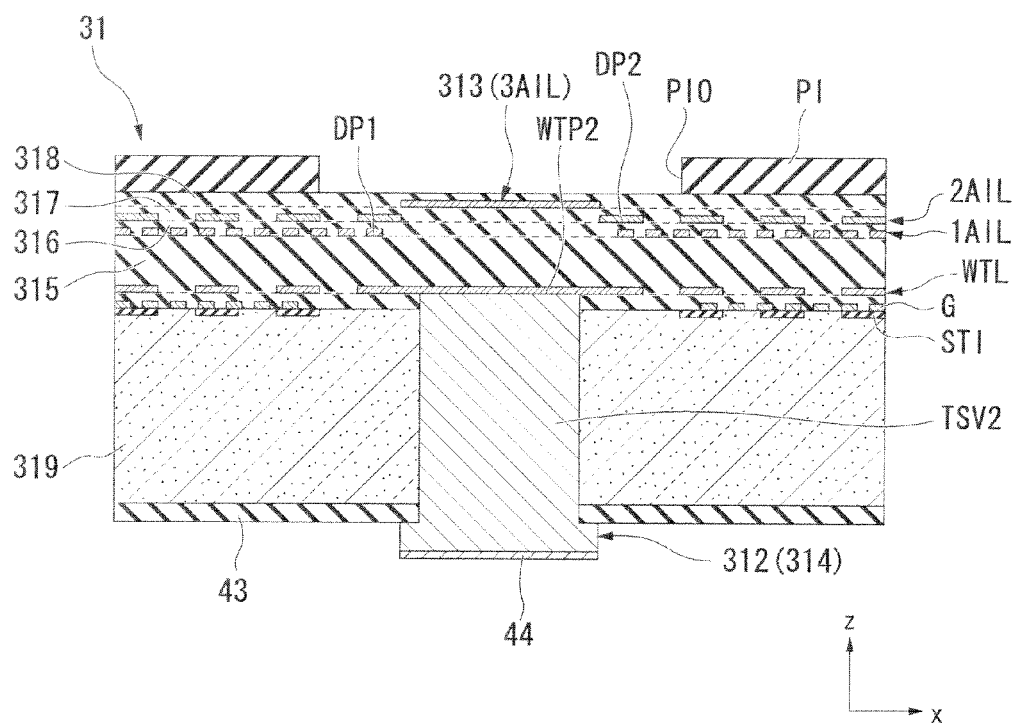
FIG. 18 is a fragmentary plan view of a memory chip in modified embodiments of the embodiments of the present invention.
Figure 19A:
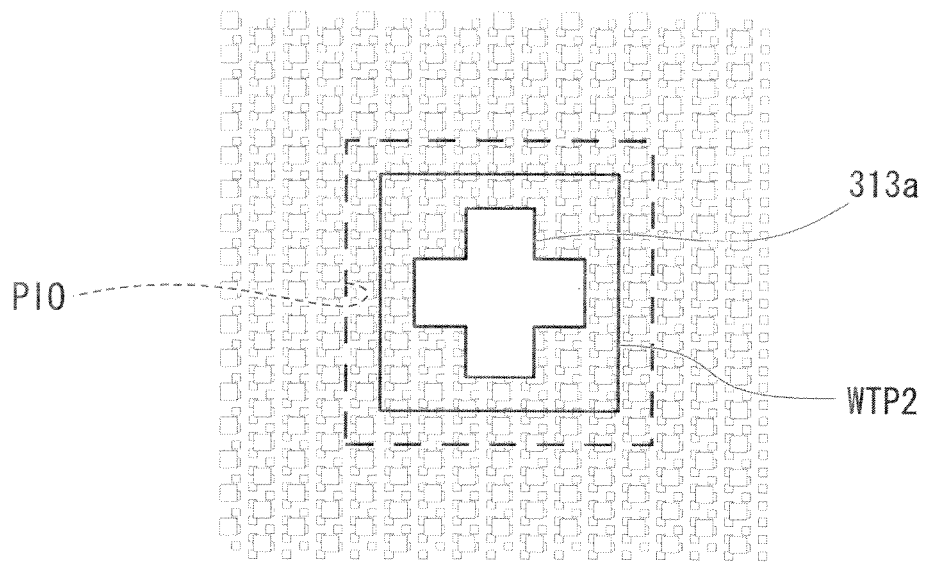
FIG. 19A is a fragmentary plan view of a mark of a memory chip in modified embodiments of the embodiments of the present invention.
Figure 19B:
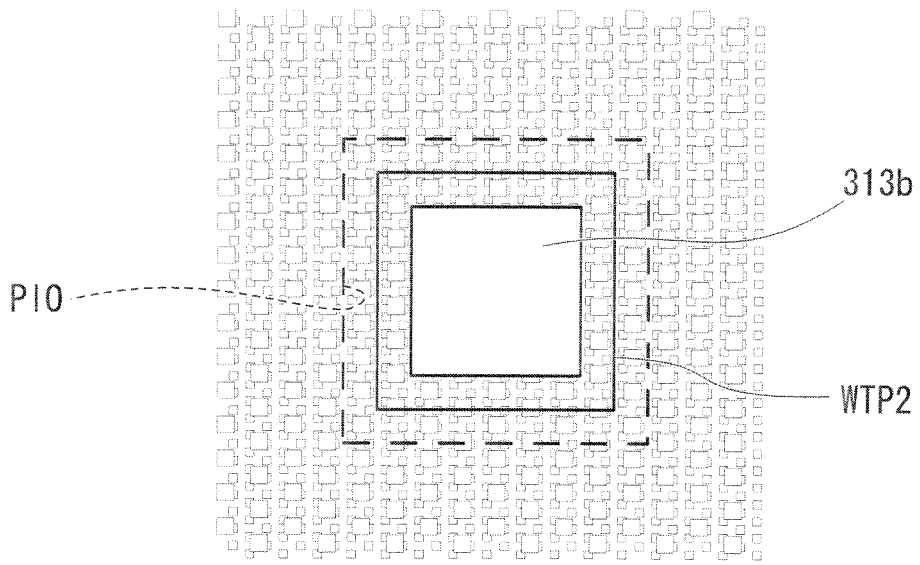
FIG. 19B is a fragmentary plan view of a mark of a memory chip in modified embodiments of the embodiments of the present invention.
Figure 19C:
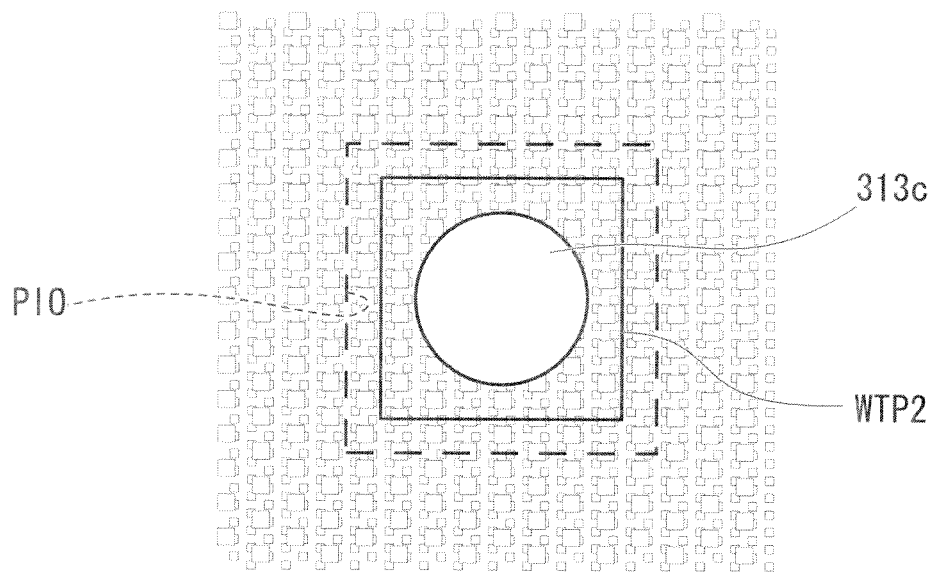
FIG. 19C is a fragmentary plan view of a mark of a memory chip in modified embodiments of the embodiments of the present invention.
Figure 19D:
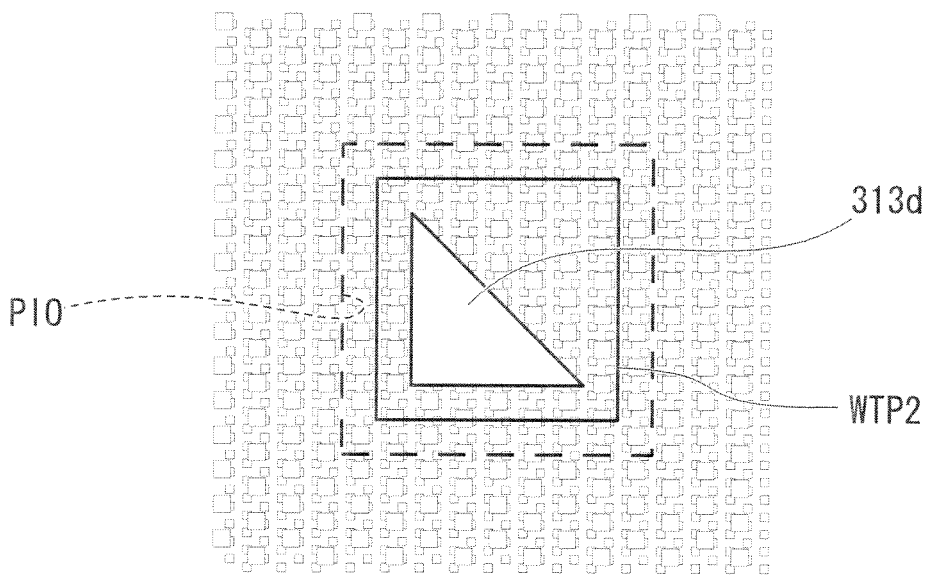
FIG. 19D is a fragmentary plan view of a mark of a memory chip in modified embodiments of the embodiments of the present invention.
Figure 20:
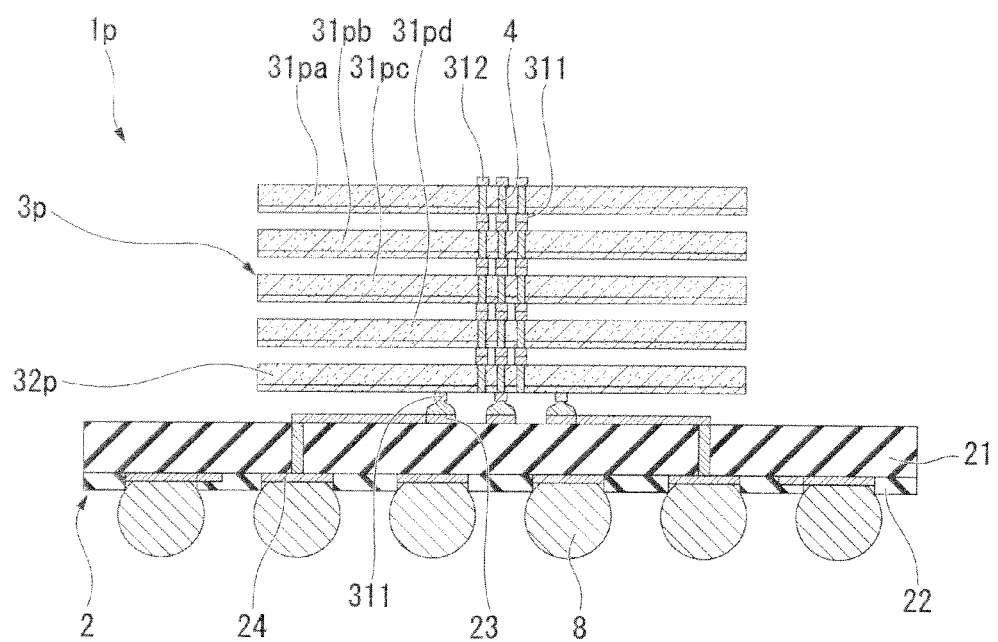
FIG. 20 is a fragmentary cross sectional elevation view of the configuration of the semiconductor device in the related art.
Figure 21:
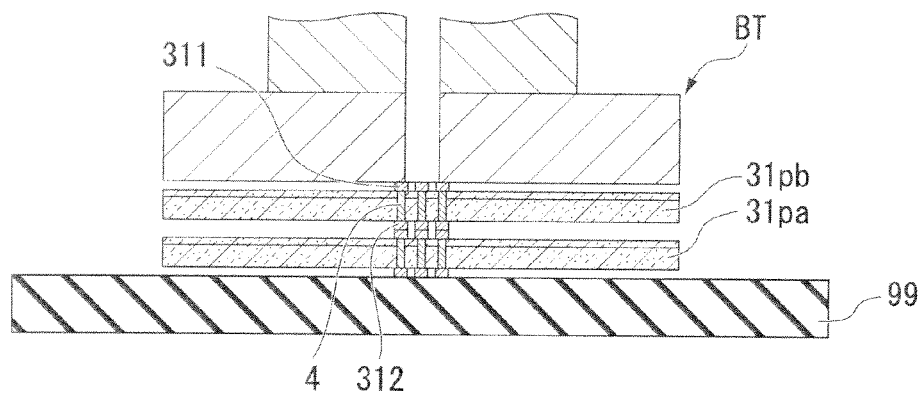
FIG. 21 is a fragmentary cross sectional elevation view of a step of stacking the memory chips in the semiconductor device in the related art.
Figure 22:
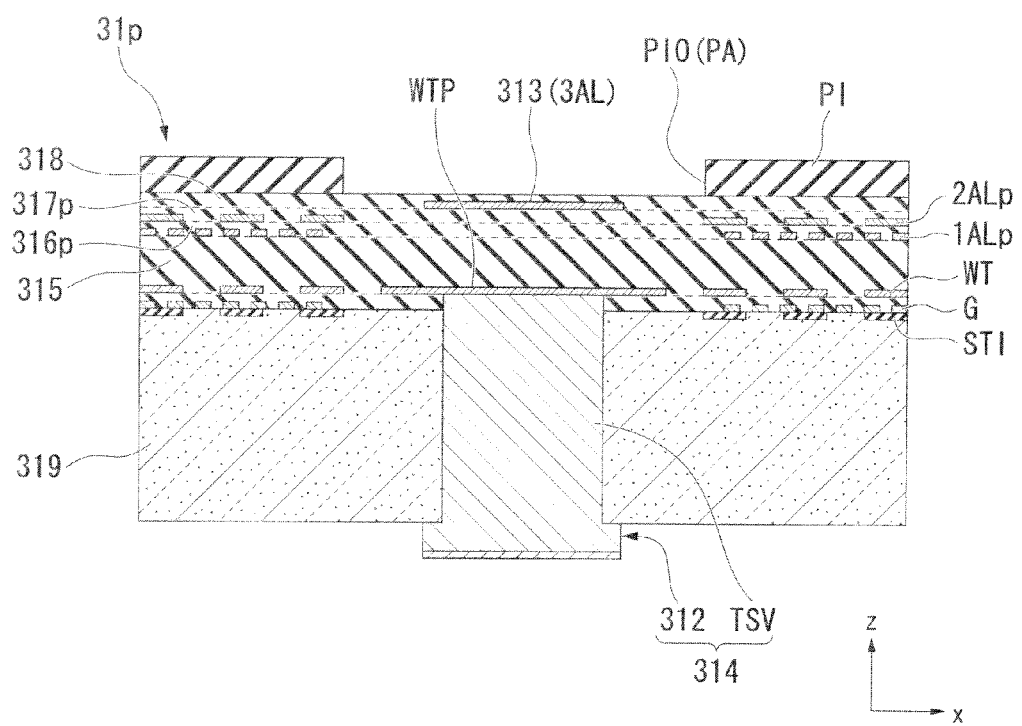
FIG. 22 is a fragmentary cross sectional elevation view of the memory chip in the related art.
Figure 23:
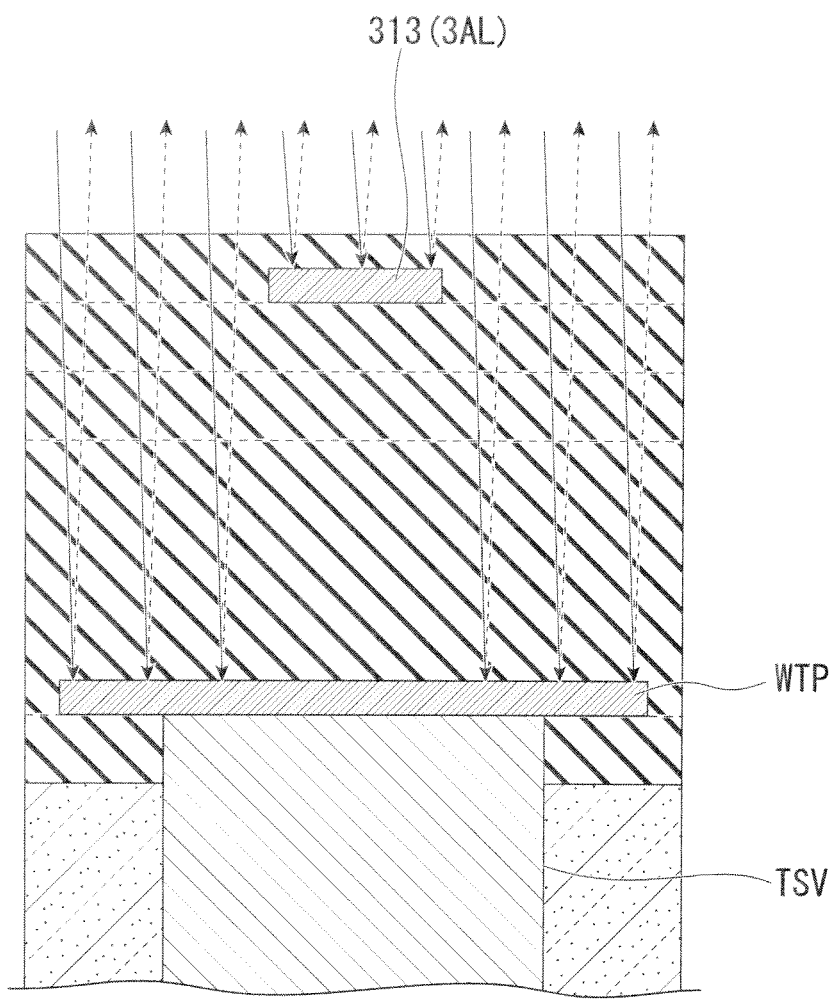
FIG. 23 is a fragmentary cross sectional elevation view of an PI opening portion of the memory chip in the related art.

In the first to third embodiments described above, patterns are arranged just below the surface mark 313 of the prohibition area PA, but as shown in FIG. 18, the patterns may be removed from just below the surface mark 313.

In the first to third embodiments described above, the surface mark 313 and the rear mark 314 have an L shape, but they are not limited thereto. FIGS. 19A to 19D are views illustrating other examples of mark shapes. As shown in FIGS. 19A to 19D, the mark may have a cross shape 313a, a square shape 313b, a circular shape 313c, and a right-angled triangular shape 313d, respectively, or have other various shapes.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a multi-level wiring structure including:
      a first wiring layer disposed at a first wiring level of the multi-level wiring structure;
      a plurality of first dummy patterns disposed over and covering the first wiring layer, each first dummy pattern of the plurality of first dummy patterns comprising a size which is substantially less than a size of the first wiring layer, and the plurality of first dummy patterns being disposed at a second wiring level of the multi-level wiring structure, the second wiring level being above the first wiring level; and
      a first mark disposed over the first wiring layer, the first mark being disposed at a third wiring level of the multi-level wiring structure, the third wiring level being above the second wiring level.

2. The semiconductor device according to claim 1, further comprising:
   a semiconductor substrate on which the multi-level wiring structure being disposed; and
   a first penetration electrode that penetrates the semiconductor substrate, and that is in contact with the first wiring layer at one end thereof.

3. The semiconductor device according to claim 2, further comprising:
   a second mark disposed at the other end of the first penetration electrode.

4. The semiconductor device according to claim 1, wherein the plurality of first patterns is electrically floated.

5. The semiconductor device according to claim 1, wherein the plurality of first patterns is positioned in a region that is vertically arranged with the first mark.

6. The semiconductor device according to claim 1, wherein the multi-level wiring structure further comprises:
   a plurality of second patterns disposed over the first wiring layer, the plurality of second patterns being disposed at a fourth wiring level of the multi-level wiring structure, the fourth wiring level being between the second wiring level and the third wiring level.

7. The semiconductor device according to claim 6, wherein each of the plurality of second patterns is larger in size than each of the plurality of first patterns.

8. The semiconductor device according to claim 2, further comprising:
   a plurality of second penetration electrodes each penetrating through the semiconductor substrate; and
   a plurality of terminals, each of the terminals being formed over the multi-level wiring structure, each of the terminals being coupled to an associated one of the plurality of second penetration electrodes,
   wherein the first penetration electrode is free from being coupled to any one of the terminals.

9. The semiconductor device according to claim 8, further comprising:
   a plurality of third patterns each being disposed at the third level of the multi-level wiring structure and being coupled between an associated one of the second penetration electrodes and an associated one of the terminals, each of the third patterns being different in shape from the first mark.

10. A semiconductor device comprising:
   a multi-level wiring structure including:
      a plurality of dummy patterns disposed over and covering a first wiring level of the multi-level wiring structure, each dummy pattern of the plurality of dummy patterns comprising a size which is substantially less than a size of the first wiring layer; and
      a first mark disposed at a second wiring level of the multi-level wiring structure, the second wiring level being above the first wiring level; and
   a resin layer disposed over the multi-level wiring structure, the resin layer having an opening that is positioned over the first mark and at least one of the plurality of dummy patterns.

11. The semiconductor device according to claim 10, further comprising:
   a semiconductor substrate on which the multi-level wiring structure is disposed;
   a penetration electrode that penetrates the semiconductor substrate; and
   a second mark coupled to the penetration electrode.

12. The semiconductor device according to claim 10, wherein the multi-level wiring structure further includes:
   a third wiring layer disposed under the first wiring layer, the third wiring layer being disposed at a third wiring level below the first wiring level, and
   wherein the penetration electrode extends to the third wiring layer.

13. The semiconductor device according to claim 10, wherein the plurality of patterns is electrically floated.

14. A semiconductor device comprising:
   a multi-level wiring structure including a first wiring level, a first level wiring layer formed in the first wiring level, and a second level wiring layer formed over the first level wiring layer;
   a plurality of dummy patterns disposed over and covering the first wiring level, each dummy pattern of the plurality of dummy patterns comprising a size which is substantially less than a size of the first level wiring layer;
   an insulation layer formed over the multi-level wiring structure and including a plurality of first openings and a second opening;
   a plurality of bump electrodes each disposed in an associated one of the first openings;
   a plurality of first wirings produced as the second level wiring layer, each of the first wirings being vertically arranged with an associated one of the first openings of the insulation layer, and each of the first wirings being coupled to an associated one of the bump electrodes;
   a second wiring produced as the second level wiring layer and vertically arranged with the second opening of the insulation layer, and the second wiring being free from a contact with any one of the bump electrodes; and a plurality of third wirings produced as the first wiring layer and disposed in a first region that is vertically arranged with the first opening of the insulation layer.

15. The semiconductor device as claimed in claim 14, wherein the multi-level wiring structure further includes a third level wiring layer, and the first level wiring layer formed over the third level wiring layer, and the semiconductor device further comprises;
   a plurality of fourth wirings each produced as the third level wiring layer and vertically arranged with a corresponding one of the first wirings,
   a fifth wiring produced as the third level wiring layer and vertically arranged with the second wiring.

16. The semiconductor device as claimed in claim 15, further comprising:
   a semiconductor substrate on which the multi-level wiring structure is formed,
   a plurality of first penetrating electrodes penetrating through the semiconductor substrate, each of the first penetrating electrodes extending to reach a corresponding one of the fourth wirings, and
   a second penetrating electrode penetrating through the semiconductor substrate and extending to reach the fifth wiring.

17. The semiconductor device as claimed in claim 15, wherein the multi-level wiring structure further includes a fourth level wiring layer intervened between the first and the third level wiring layers, the device further comprises,
   a plurality of sixth wirings produced as the fourth level wiring layer and disposed in a second region that vertically arranged with the first region.

18. The semiconductor device as claimed in claim 17, wherein each of the sixth wirings is smaller in size than each of the third wirings.

19. The semiconductor device as claimed in claim 15, wherein each of the fourth wirings is electrically connected to the corresponding one of the first wirings, and the fifth wiring is electrically disconnected from the second wiring.

20. The semiconductor device as claimed in claim 14, wherein each of the third wirings is electrically floated.

* * * * *